(12) United States Patent
Lee et al.

(10) Patent No.: US 12,040,366 B2
(45) Date of Patent: Jul. 16, 2024

(54) FABRICATING SUB-MICRON CONTACTS TO BURIED WELL DEVICES

(71) Applicant: The Boeing Company, Chicago, IL (US)

(72) Inventors: Kangmu Min Lee, Playa Vista, CA (US); Maxwell Daehan Choi, Thousand Oaks, CA (US); Jeffrey Alden Wright, Thousand Oaks, CA (US); Wonill Ha, Thousand Oaks, CA (US); Clayton Jackson, Thousand Oaks, CA (US); Michael Pemberton Jura, Santa Monica, CA (US); Adele Schmitz, Thousand Oaks, CA (US); James Chappell, Woodland Hills, CA (US)

(73) Assignee: The Boeing Company, Chicago, IL (US)

( * ) Notice: Subject to any disclaimer, the term of this patent is extended or adjusted under 35 U.S.C. 154(b) by 308 days.

(21) Appl. No.: 17/303,809

(22) Filed: Jun. 8, 2021

(65) Prior Publication Data
US 2022/0028989 A1 Jan. 27, 2022

Related U.S. Application Data

(60) Provisional application No. 63/056,973, filed on Jul. 27, 2020.

(51) Int. Cl.
H01L 29/06 (2006.01)
H01L 21/04 (2006.01)
(Continued)

(52) U.S. Cl.
CPC .... H01L 29/41766 (2013.01); H01L 21/0465 (2013.01); H01L 21/2652 (2013.01);
(Continued)

(58) Field of Classification Search
CPC ... H01L 21/762–76297; H01L 29/0649; H01L 29/0653; H01L 29/45–458;
(Continued)

(56) References Cited

U.S. PATENT DOCUMENTS 5,950,090 A * 9/1999 Chen ............... H01L 29/6659
257/E21.546
6,235,596 B1 * 5/2001 Liao ............... H01L 29/1045
257/E29.054

(Continued)

OTHER PUBLICATIONS

Extended European Search Report regarding European Application No. 21180520.5, dated Nov. 22, 2021, 8 pages.

Primary Examiner — Eric A. Ward
(74) Attorney, Agent, or Firm — Yee & Associates, P.C.

(57) ABSTRACT

A method for forming a semiconductor structure. Two isolation structures are formed in a semiconductor. A cavity is etched in the semiconductor between the two isolation structures in the semiconductor. Dopants are implanted into a bottom side of the cavity to form a doped region in the semiconductor below the cavity between the two isolation structures. A contact is formed in the cavity. The contact is on the doped region and in direct contact with the doped region.

8 Claims, 14 Drawing Sheets

(51) Int. Cl.
  *H01L 21/265* (2006.01)
  *H01L 21/762* (2006.01)
  *H01L 29/40* (2006.01)
  *H01L 29/417* (2006.01)
  *H01L 21/266* (2006.01)
  *H01L 29/08* (2006.01)
  *H01L 29/16* (2006.01)
  *H01L 29/20* (2006.01)

(52) U.S. Cl.
  CPC .. *H01L 21/26553* (2013.01); *H01L 21/76232* (2013.01); *H01L 29/401* (2013.01); *H01L 21/266* (2013.01); *H01L 29/0847* (2013.01); *H01L 29/16* (2013.01); *H01L 29/1608* (2013.01); *H01L 29/20* (2013.01); *H01L 29/2003* (2013.01)

(58) Field of Classification Search
  CPC ......... H01L 29/41766; H01L 29/41783; H01L 21/76224–76237
  See application file for complete search history.

(56) References Cited

U.S. PATENT DOCUMENTS

| | | | |
|---|---|---|---|
| 6,355,539 B1* | 3/2002 | Lai | H01L 21/76232 257/E21.549 |
| 2004/0108559 A1* | 6/2004 | Sugii | H01L 29/7842 257/411 |
| 2006/0138549 A1* | 6/2006 | Ko | H01L 29/0653 257/E21.624 |
| 2006/0220124 A1* | 10/2006 | Ohtake | H01L 29/7835 257/E29.268 |
| 2009/0001420 A1* | 1/2009 | Matsumoto | H01L 29/7843 257/190 |
| 2012/0032256 A1 | 2/2012 | Takaishi et al. | |
| 2013/0095619 A1* | 4/2013 | Wehella-Gamage | H01L 29/66636 438/164 |
| 2013/0256661 A1 | 10/2013 | Pagani | |
| 2015/0295068 A1* | 10/2015 | Yin | H01L 29/7848 438/285 |
| 2018/0308841 A1* | 10/2018 | Liu | H01L 29/404 |

* cited by examiner

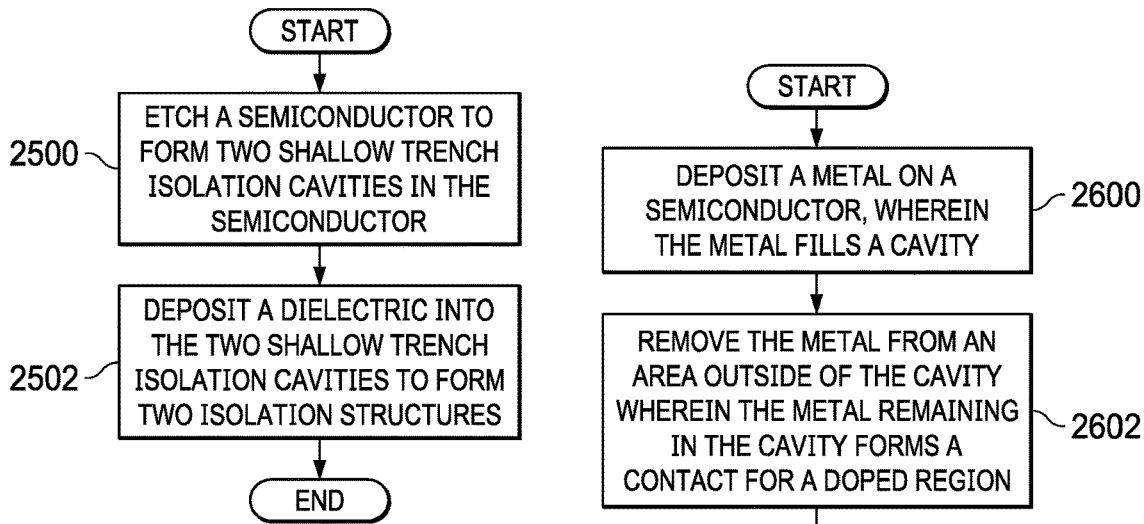
FIG. 25
FIG. 26
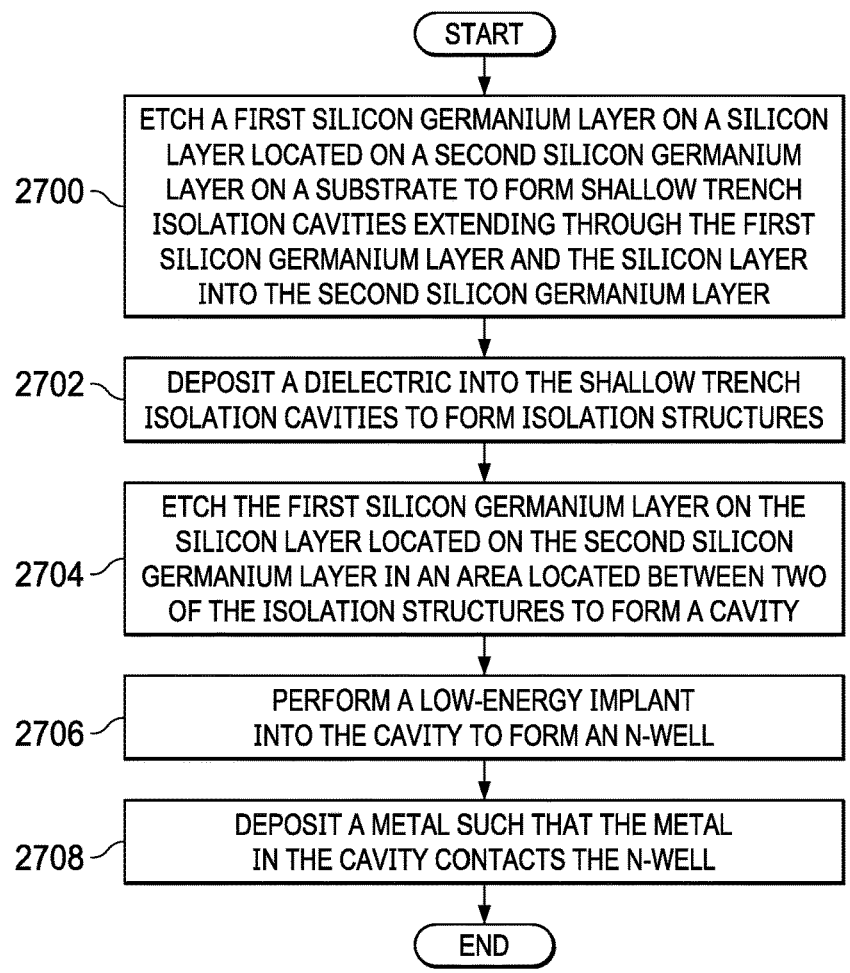
FIG. 27

FABRICATING SUB-MICRON CONTACTS TO BURIED WELL DEVICES

RELATED PROVISIONAL APPLICATION

This application claims the benefit of U.S. Provisional Patent Application Ser. No. 63/056,973, filed Jul. 27, 2020, and entitled "Fabricating Sub-Micron Contacts to Buried Well Devices."

BACKGROUND INFORMATION

1. Field

The present disclosure relates generally to semiconductors and, in particular, to a method for fabricating semiconductor structures and, still more particularly, to a method for fabricating contacts to active areas in cavities in the semiconductor structures.

2. Background

In manufacturing integrated circuits, reducing sizes of features for semi-circuits, such as transistors, can allow for increased density of the transistors. By reducing the sizes of transistors and other semiconductor devices, smaller chips, increased power efficiency, and other improvements can be achieved. For example, increased power efficiency can result in smaller transistors that can perform more calculations with less heat generation as compared to larger transistors. Further, with smaller die sizes, manufacturing costs can be reduced and chip density increases.

The technologies for different sized features in semiconductor manufacturing are referred to as "process nodes" or "technology nodes". As the size of a technology node decreases, smaller feature sizes are present with those technologies that enable fabricating smaller transistors, which are smaller and more power efficient.

As the size of chips decrease, challenges are present with fabricating semiconductor devices with smaller features. For example, increased difficulty is present with lithography processes as feature sizes decrease. As another example, crosstalk and capacitive loading increases as the frequency of operation increases with higher transistor density. Another issue involves dissipating heat from the operation of transistors with higher densities. Further, as the feature sizes decrease, tighter tolerances are needed for manufacturing transistors and other semiconductor structures.

Therefore, it would be desirable to have a method and apparatus that take into account at least some of the issues discussed above, as well as other possible issues. For example, it would be desirable to have a method and apparatus that overcome a technical problem with manufacturing semiconductors with smaller features.

SUMMARY

An embodiment of the present disclosure provides a method for fabricating a semiconductor structure. A first silicon germanium layer is etched onto a silicon layer located on a second silicon germanium layer on a substrate to form shallow trench isolation cavities extending through the first silicon germanium layer and the silicon layer into the second silicon germanium layer. A dielectric is deposited in the shallow trench isolation cavities to form isolation structures. The first silicon germanium layer on the silicon layer located on the second silicon germanium layer in an area located between two of the isolation structures is etched to form a cavity. Dopants are implanted into the cavity is performed to form an n-well. The dopants are implanted at an energy level that reduces a lateral straggle of the dopants to a desired level. A metal is deposited such that the metal in the cavity contacts the n-well.

In another embodiment of the present disclosure, a method forms a semiconductor structure. Two isolation structures are formed in a semiconductor. A cavity is etched into the semiconductor between the two isolation structures in the semiconductor. Dopants are implanted into a bottom side of the cavity to form a doped region in the semiconductor below the cavity between the two isolation structures. A contact is formed in the cavity. The contact is on the doped region and in direct contact with the doped region.

In yet another embodiment of the present disclosure, a semiconductor structure comprises a semiconductor. Two shallow trench isolation structures are in the semiconductor. A cavity is between the two shallow trench isolation structures. An active area is located in the semiconductor below the cavity. A metal contact is in the cavity. The metal contact is in direct contact with the active area.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

FIG. 25 is an illustration of a flowchart of forming isolation structures in a semiconductor structure in accordance with an illustrative embodiment;

FIG. 26 is an illustration of a flowchart of forming a contact in accordance with an illustrative embodiment;

FIG. 27 is an illustration of a flowchart of a process for fabricating a semiconductor structure in accordance with an illustrative embodiment;

DETAILED DESCRIPTION

Figure 1:
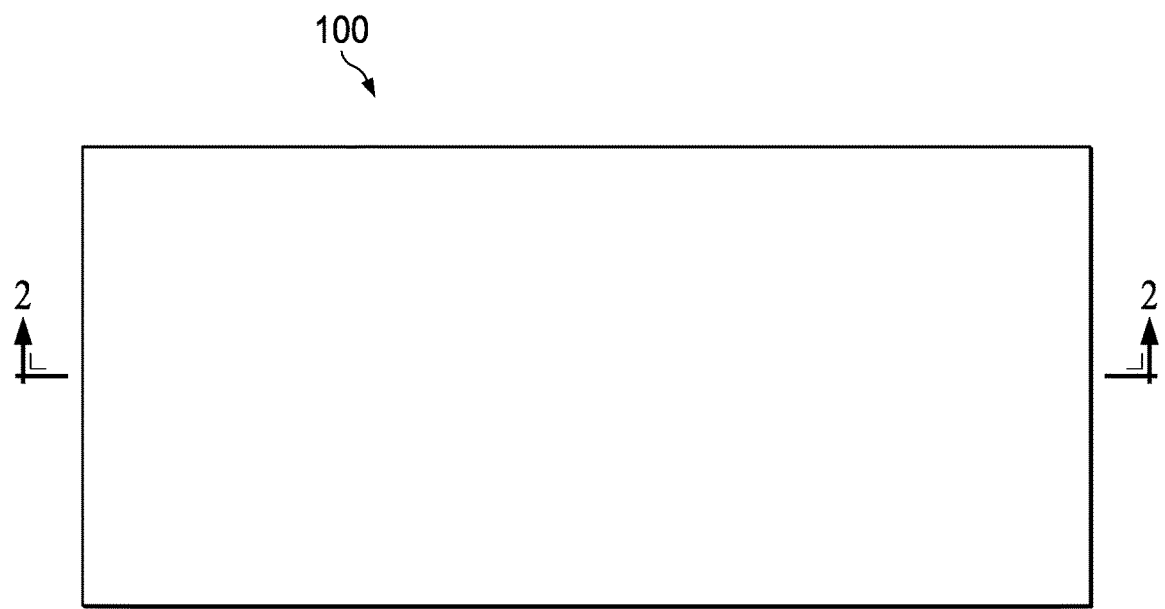
FIG. 1 is an illustration of a plan view of a semiconductor in accordance with an illustrative embodiment.

The illustrative embodiments recognize and take into account one or more different considerations. For example, the illustrative embodiments recognize and take into account that it is beneficial to reduce an active area of an n-well transistor from a few microns to a submicron level. The illustrative embodiments recognize and take into account that this reduction of feature size can bring a contact location closer to a device core area, thus leading to shorter signal lines and smaller charge accumulation areas. The illustrative embodiments recognize and take into account that a reduction in the size of an n-well area can reduce the footprint of the device.

The illustrative embodiments recognize and take into account that in reducing the size of active areas such as an n-well, access resistance between a contact and an active area becomes more important. Further, the illustrative embodiments recognize and take into account that implant straggle is also a greater issue as the size of the active area becomes smaller. For example, when the width of the active area becomes smaller, a tolerance for straggle decreases. The straggle is the standard deviation of a Gaussian distribution of implanted ions in a direction perpendicular to ion motion.

The illustrative embodiments recognize and take into account that one manner in which access resistance and implant straggle can be reduced involves using a recess etch with isolation structures followed by implanting of dopants at an energy level that reduces a lateral straggle of the dopants to a desired level.

Thus, the illustrative embodiments provide a method and apparatus for fabricating contacts to a structure such as a buried well. For example, the illustrative example can provide a method to fabricate a submicron contact to a buried well in a silicon and silicone germanium (Si/SiGe) field-effect device. The process in the illustrative example allows for improved alignment of a contact to a recessed active area such as the buried well. In the illustrative example, the contact is self-aligned in which implantation for the recessed active area and deposition of the contact is performed using a single lithography step. In other words, the same mask and pattern used to etch a cavity for the buried well or other buried active area is also used to form the contact.

Illustrative embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive.

Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

For purposes of the description hereinafter, the terms "upper," "lower," "right," "left," "vertical," "horizontal," "top," "bottom," and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element.

In this disclosure, when an element, such as a layer, a region, or a substrate, is referred to as being "on" or "over" another element, the element can be directly on the other element or intervening elements can also be present. In contrast, when an element is referred to as being "directly on," "directly over," or "on and in direct contact with" another element, intervening elements are not present, and the element is in contact with the other element.

The processes, steps, and structures described below do not form a complete process flow for manufacturing integrated circuits. The disclosure can be practiced in conjunction with integrated circuit fabrication techniques currently used in the art, and only so much of the commonly practiced process steps are included as necessary for an understanding of the different examples of the present disclosure. The figures represent cross-sections of a portion of an integrated circuit during fabrication and are not drawn to scale, but instead are drawn so as to illustrate different illustrative features of the disclosure.

With reference now to FIGS. 1-20, illustrations of cross-sections in a process to form a semiconductor structure are depicted in accordance with an illustrative embodiment. With reference first to FIG. 1, an illustration of a plan view of a semiconductor is depicted in accordance with an illustrative embodiment. In this illustrative example, semiconductor 100 can be processed to fabricate a field effect transistor or other suitable device.

Figure 2:
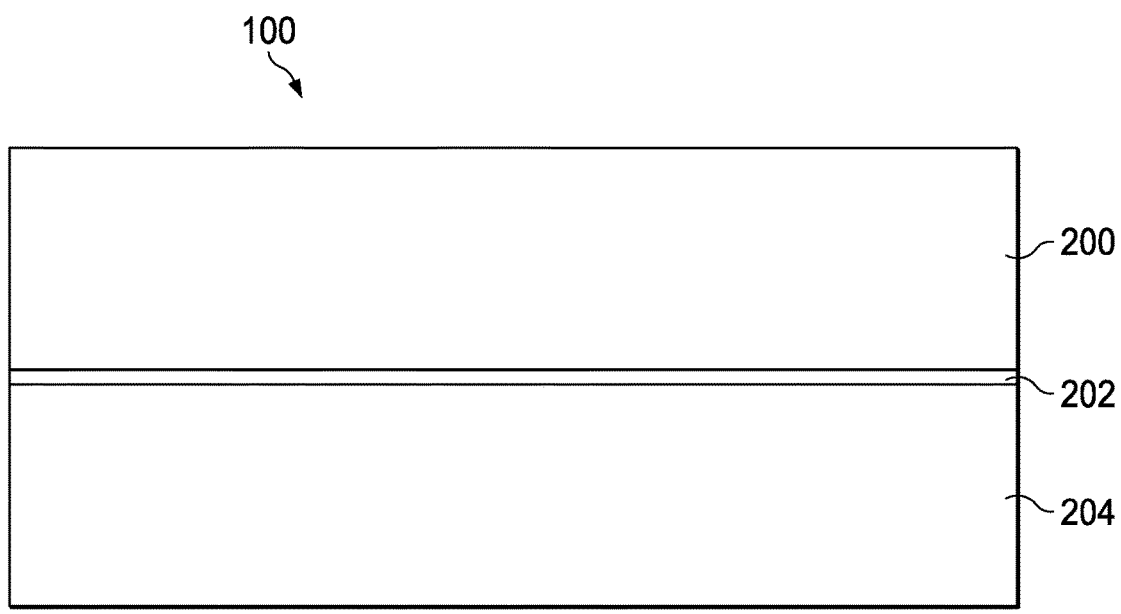
FIG. 2 is an illustration of a cross-sectional view of a semiconductor in accordance with an illustrative embodiment.

Turning to FIG. 2, an illustration of a cross-sectional view of a semiconductor is depicted in accordance with an illustrative embodiment. In the illustrative examples, the same reference numeral may be used in more than one figure. This reuse of a reference numeral in different figures represents the same element in the different figures.

In this illustrative example, semiconductor 100 is shown in a cross-sectional view taken along the lines 2-2 in FIG. 1. As depicted, semiconductor 100 is a set of semiconductor layers and, in this example, is comprised of first silicon germanium layer 200, silicon layer 202, and second silicon germanium layer 204.

As used herein, "a set of," when used with reference to items, means one or more items. For example, "a set of semiconductor layers" is one or more semiconductor layers.

In this illustrative example, first silicon germanium layer 200 is in direct contact with silicon layer 202, which is in direct contact with second silicon germanium layer 204. These layers can be processed to fabricate a semiconductor structure such as a silicon and silicon germanium (Si/SiGe) field-effect transistor (FET) or some other suitable device or structure that can be part of the device. These layers are located on a substrate (not shown) in this figure.

Figure 3:
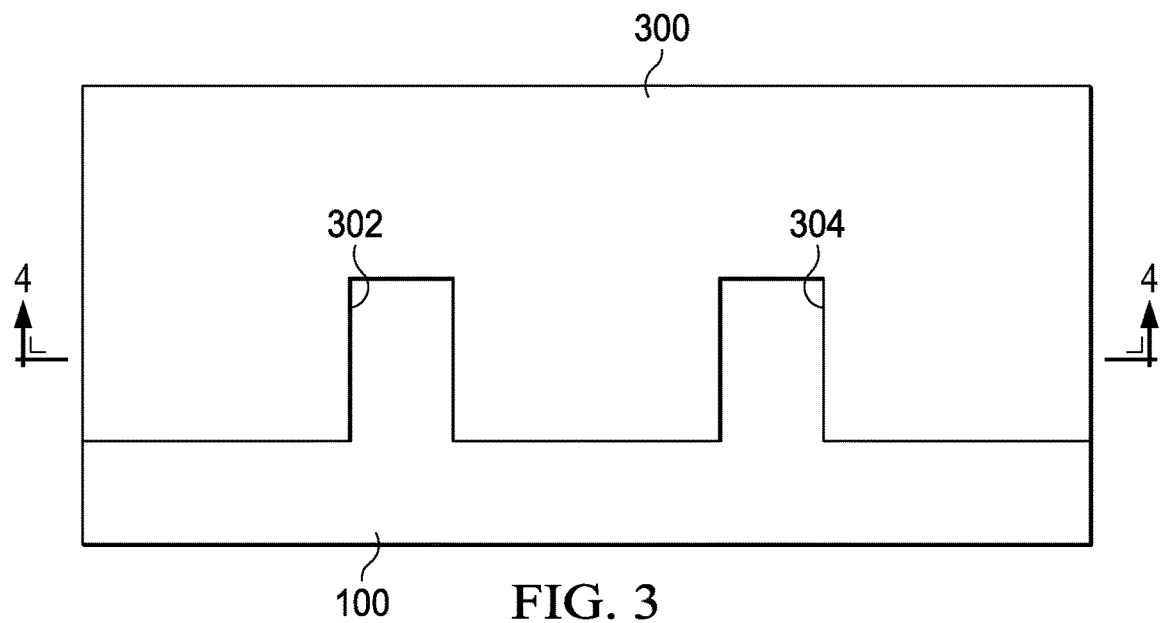
FIG. 3 is an illustration of a top plan view of a hard mask on a semiconductor structure in accordance with an illustrative environment.

Turning next to FIG. 3, an illustration of a top plan view of a hard mask on a semiconductor structure is depicted in accordance with an illustrative environment. As depicted, hard mask 300 is patterned with openings for etching semiconductor 100 to form trench isolation cavities, which comprise shallow trench isolation cavity 302 and shallow trench isolation cavity 304.

As depicted, hard mask 300 is comprised of an inorganic material in contrast to a polymer or other organic soft resist material. In this illustrative example, hard mask 300 can provide better control of a profile and sidewalls when performing etching operations such as a recess etch or etches that involve plasma etching. In this illustrative example, hard mask 300 is comprised of $SiN_x$. In other illustrative examples, hard mask 300 can be comprised of other inorganic materials such as a metal oxide, a silicon oxide, or other suitable materials. In this example, hard mask 300 can also be referred to as an etch mask.

Figure 4:
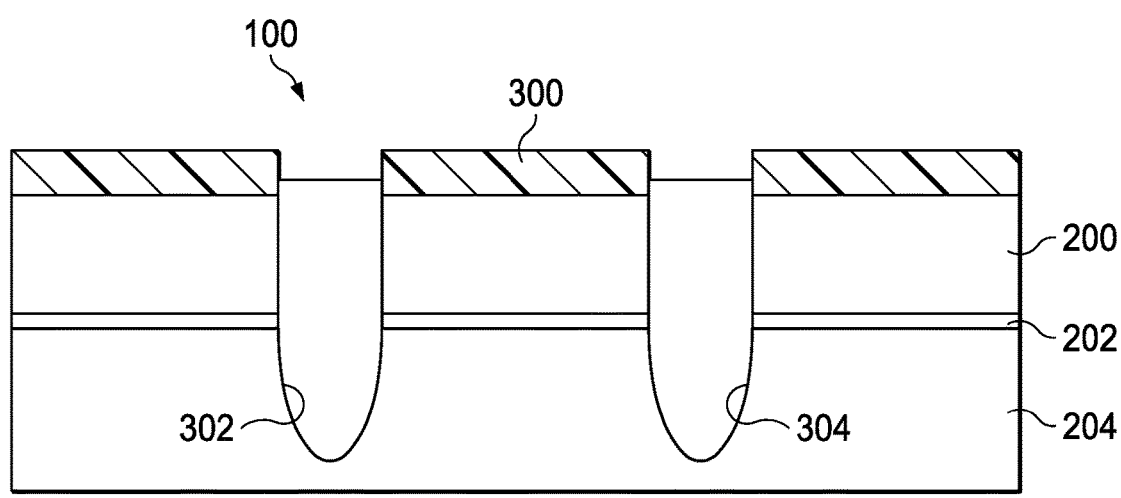
FIG. 4 is an illustration of a cross-sectional view of a semiconductor with shallow trench isolation cavities and a hard mask in accordance with an illustrative embodiment.

In FIG. 4, an illustration of a cross-sectional view of a semiconductor with shallow trench isolation cavities and a hard mask is depicted in accordance with an illustrative embodiment. In this depicted example, a view of semiconductor 100 is shown in a cross-sectional view taken along lines 4-4 in FIG. 3. As depicted in this view, shallow trench isolation cavity 302 and shallow trench isolation cavity 304 extend through first silicon germanium layer 200 and silicon layer 202 and into second silicon germanium layer 204.

Figure 5:
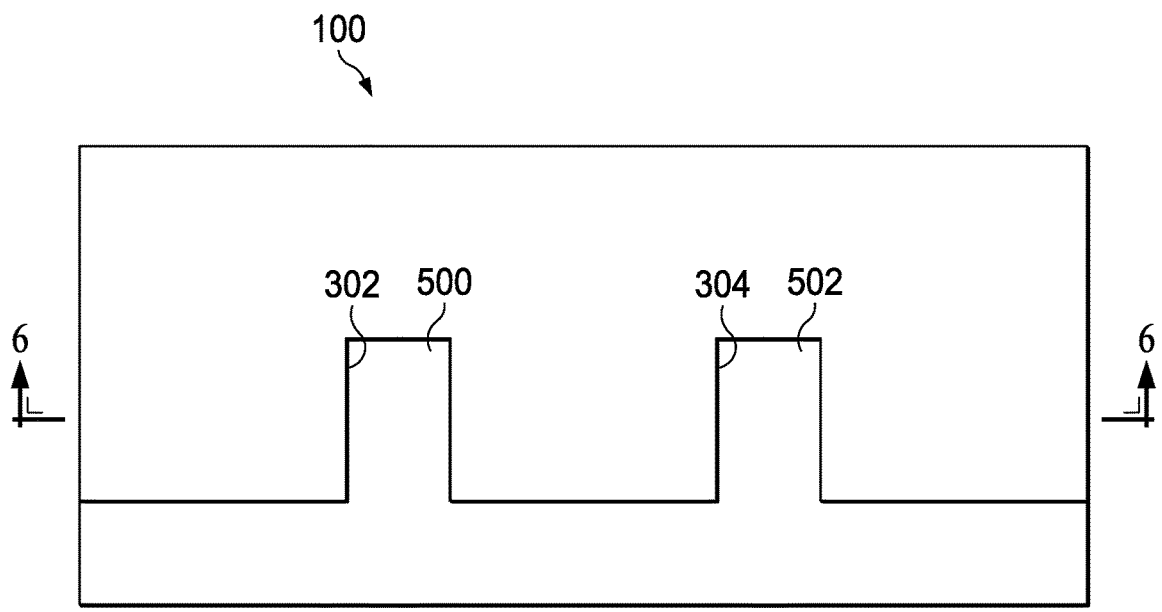
FIG. 5 is an illustration of a top plan view of a semiconductor with isolation structures in accordance with an illustrative embodiment.

With reference next to FIG. 5, an illustration of a top plan view of a semiconductor with isolation structures is depicted in accordance with an illustrative embodiment. In this figure, a dielectric, such as silicon oxide ($SiO_2$) has been deposited into the shallow trench isolation cavities, shallow trench isolation cavity 302 and shallow trench isolation cavity 304, to form isolation structures. These isolation structures comprise isolation structure 500 and isolation structure 502. These isolation structures are formed from depositing a dielectric such as silicon oxide into the shallow trench isolation cavities. In this example, hard mask 300 is removed after forming isolation structure 500 and isolation structure 502.

Figure 6:
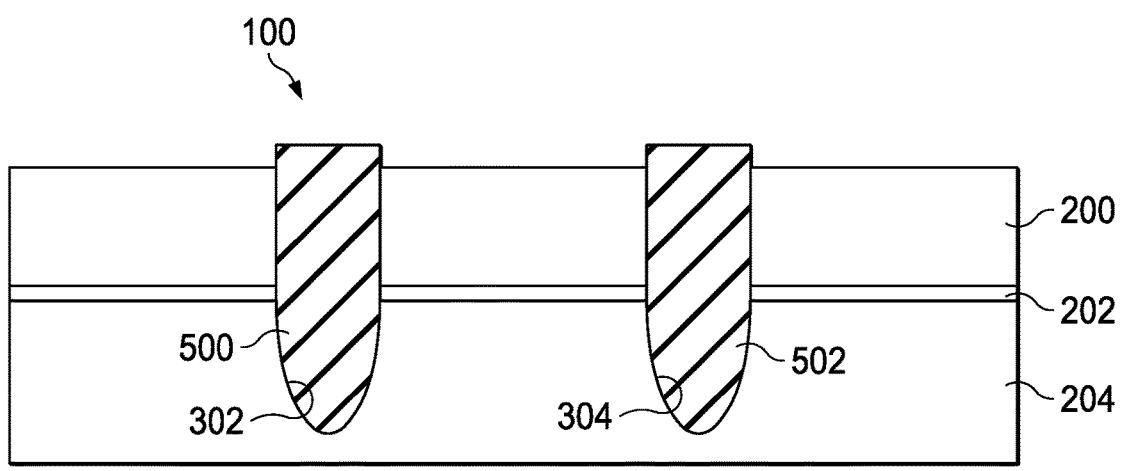
FIG. 6 is an illustration of a cross-sectional view of a semiconductor with isolation structures in accordance with an illustrative embodiment.

Turning to FIG. 6, an illustration of a cross-sectional view of a semiconductor with isolation structures is depicted in accordance with an illustrative embodiment. In this depicted example, a view of semiconductor 100 is shown in a cross-sectional view taken along lines 6-6 in FIG. 5. As can be seen in this cross-sectional view, isolation structure 500 and isolation structure 502 are formed from a dielectric filling shallow trench isolation cavity 302 and shallow trench isolation cavity 304, respectively.

Figure 7:
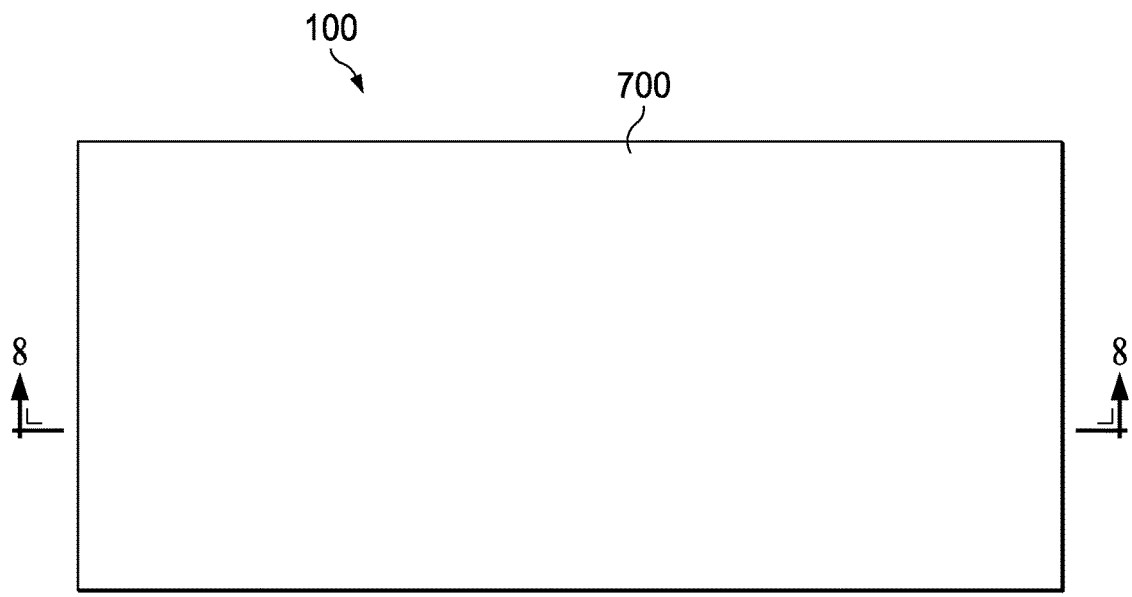
FIG. 7 is an illustration of a top plan view of a semiconductor with a bilayer hard mask in accordance with an illustrative embodiment.

With reference to FIG. 7, an illustration of a top plan view of a semiconductor with a bilayer hard mask is depicted in accordance with an illustrative embodiment. In this view, bilayer hard mask 700 is shown on semiconductor 100.

Figure 8:
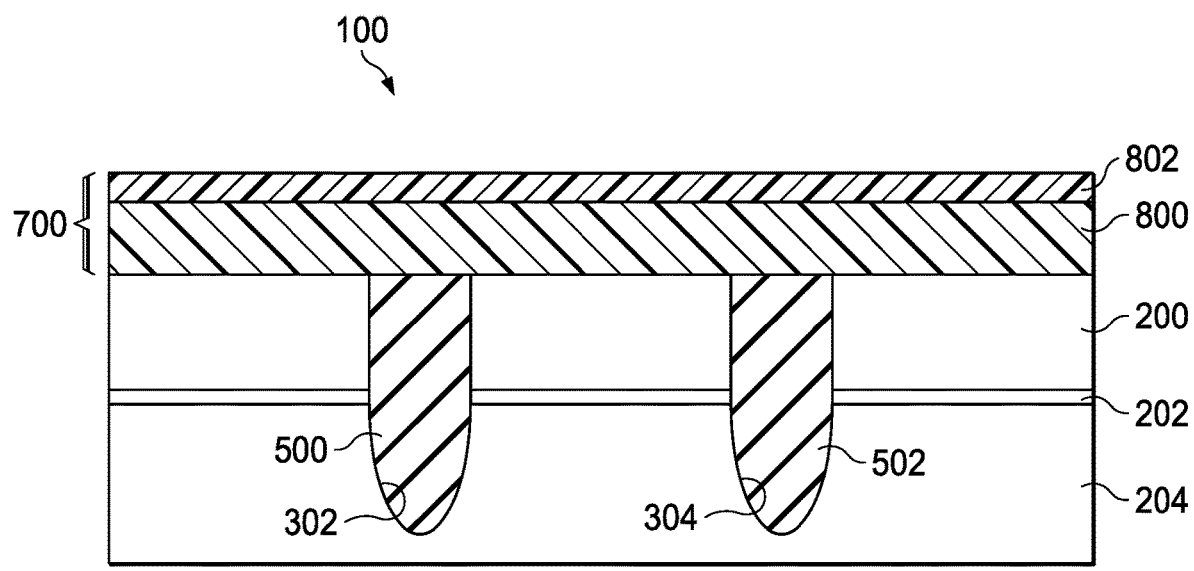
FIG. 8 is an illustration of a cross-sectional view of a semiconductor with a bilayer hard mask in accordance with an illustrative embodiment.

In FIG. 8, an illustration of a cross-sectional view of a semiconductor with a bilayer hard mask is depicted in accordance with an illustrative embodiment. In this depicted example, semiconductor 100 is shown in a cross-sectional view taken along lines 8-8 in FIG. 7.

In this illustrative example, bilayer hard mask 700 is comprised of first hard mask layer 800 and second hard mask layer 802. These hard mask layers are comprised of different types of material. In other words, first hard mask layer 800 is comprised of a different type of material from second hard mask layer 802. In this illustrative example, first hard mask layer 800 can be comprised of a dielectric such as silicon oxide. Second hard mask layer 802 can be comprised of another inorganic material such as a metal alloy, a silicon nitride, or other suitable material other than silicon oxide.

Figure 9:
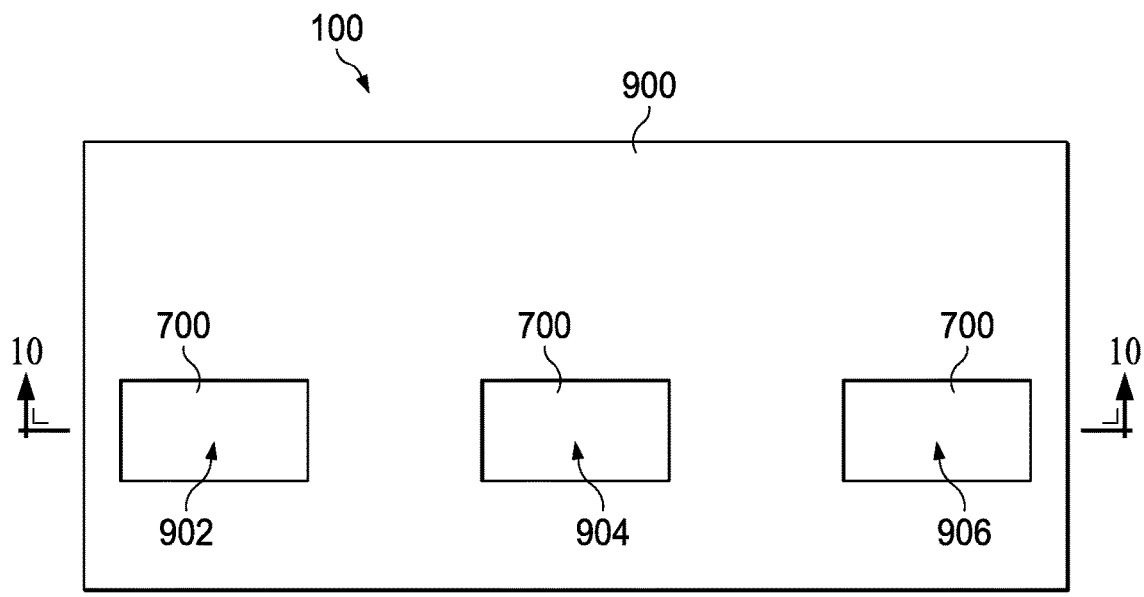
FIG. 9 is an illustration of a top plan view of a semiconductor with a patterned photoresist on a bilayer hard mask in accordance with an illustrative embodiment.

With reference next to FIG. 9, an illustration of a top plan view of a semiconductor with a patterned photoresist on a bilayer hard mask is depicted in accordance with an illustrative embodiment. In this view, photoresist 900 is comprised of an organic material and has been patterned with openings, such as opening 902, opening 904, and opening 906. In this illustrative example, these openings are made to expose bilayer hard mask 700 in areas where an etching process is to be performed to form a cavity.

Figure 10:
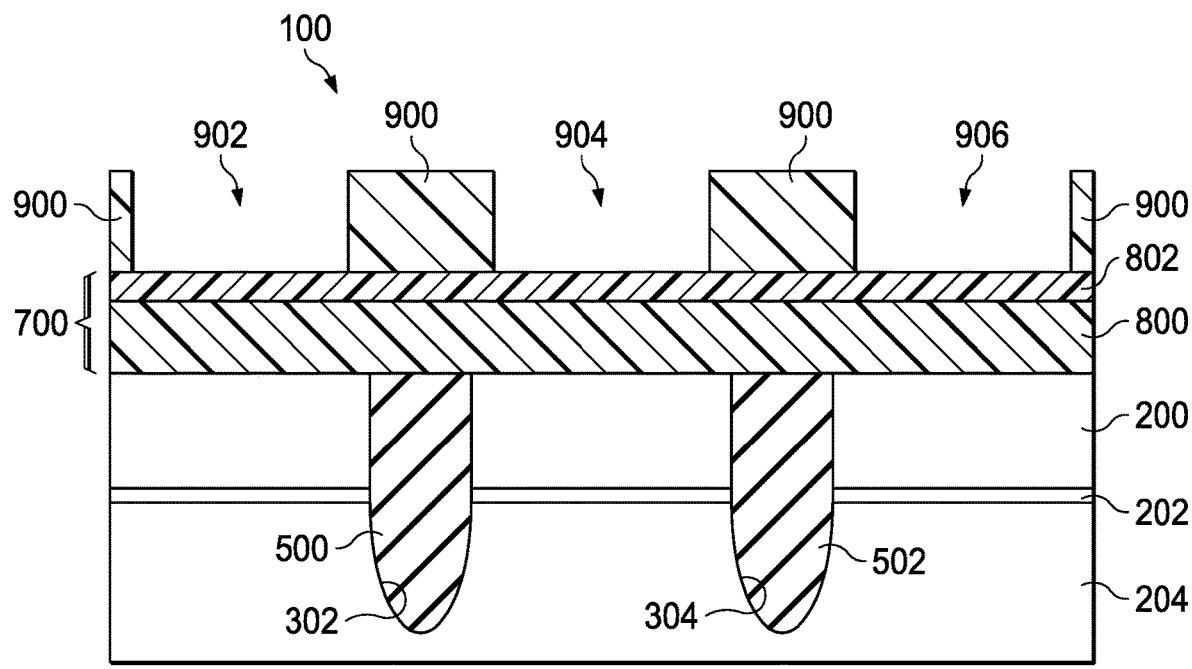
FIG. 10 is an illustration of a cross-sectional view of a semiconductor with an organic photoresist patterned to expose openings in accordance with an illustrative embodiment.

Turning now to FIG. 10, an illustration of a cross-sectional view of a semiconductor with an organic photoresist patterned to expose openings is depicted in accordance with an illustrative embodiment. In this depicted example, semiconductor 100 is shown in a cross-sectional view taken along lines 10-10 in FIG. 9 in which opening 902, opening 904, and opening 906 are present in photoresist 900. As depicted, these openings in photoresist 900 are located to etch cavities located between and on either side of isolation structure 500 and isolation structure 502.

Figure 11:
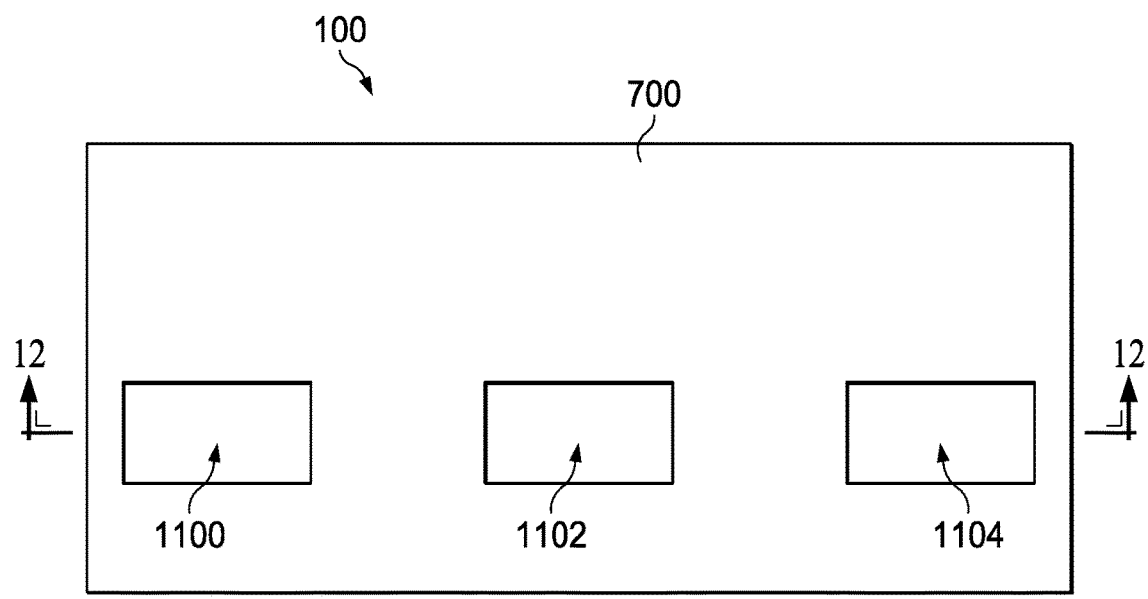
FIG. 11 is an illustration of a top plan view of a semiconductor with cavities formed in the semiconductor in accordance with an illustrative embodiment.

Turning to FIG. 11, an illustration of a top plan view of a semiconductor with cavities formed in the semiconductor is depicted in accordance with an illustrative embodiment. As depicted in this view, cavities comprising cavity 1100, cavity 1102, and cavity 1104 have been formed in semiconductor 100 through opening 902, opening 904, and opening 906 in photoresist 900 using an etching process. As illustrated in this figure, photoresist 900 has been removed exposing bilayer hard mask 700. Openings in photoresist 900 allows for etching of cavities. In this example, etching did not occur where photoresist 900 was present.

Figure 12:
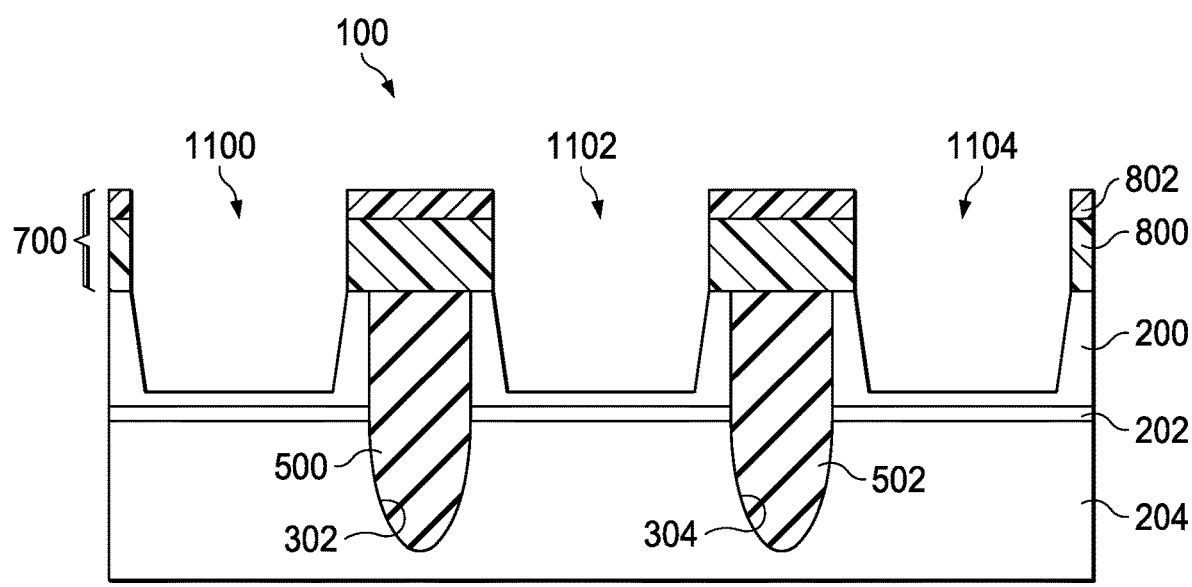
FIG. 12 is an illustration of a cross-sectional view of semiconductor cavities in accordance with an illustrative embodiment.

In FIG. 12, an illustration of a cross-sectional view of semiconductor cavities is depicted in accordance with an illustrative embodiment. In this depicted example, semiconductor 100 is shown in a cross-sectional view taken along lines 12-12 in FIG. 11.

In this view, cavity 1100, cavity 1102, and cavity 1104 extend through first silicon germanium layer 200 but not through silicon layer 202 or second silicon germanium layer 204 in semiconductor 100. In this illustrative example, the cavities are recessed cavities extending into first silicon germanium layer 200 in semiconductor 100. Cavity 1100, cavity 1102, and cavity 1104 can each have a width from about 50 nm to about 200 nm. Each of these cavities can have a depth from about 50 nm to about 200 nm. In this illustrative example, the depth of the cavity can be measured from the surface of semiconductor 100.

In the illustrative example, cavity 1100, cavity 1102, and cavity 1104 can each have a depth of about 20 nm above silicon layer 202. When this value is used, the depth for these cavities can be based on the thickness of first silicon germanium layer 200 above silicon layer 202.

Figure 13:
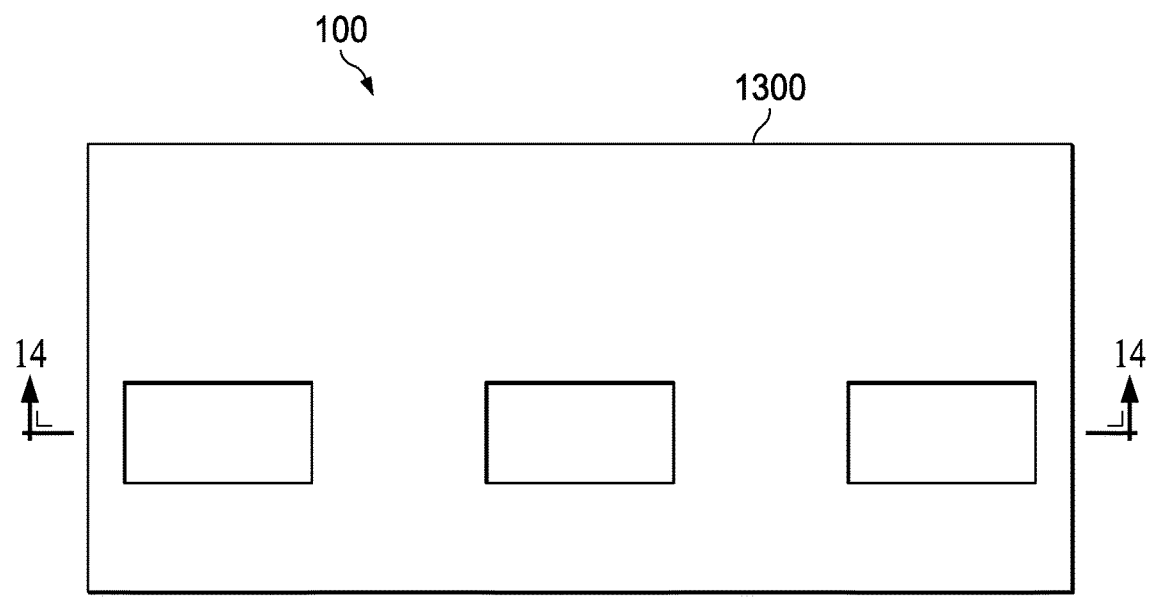
FIG. 13 is an illustration of a top plan view of a semiconductor with a liner in accordance with an illustrative embodiment.

With reference now to FIG. 13, an illustration of a top plan view of a semiconductor with a liner is depicted in accordance with an illustrative embodiment. In this illustrative example, liner 1300 is deposited on semiconductor 100. Liner 1300 is an atomic layer deposition (ALD) liner. This type of liner can be formed using a thin film deposition technique. This type of technique can be based on a sequential use of a gas phase chemical process.

Figure 14:
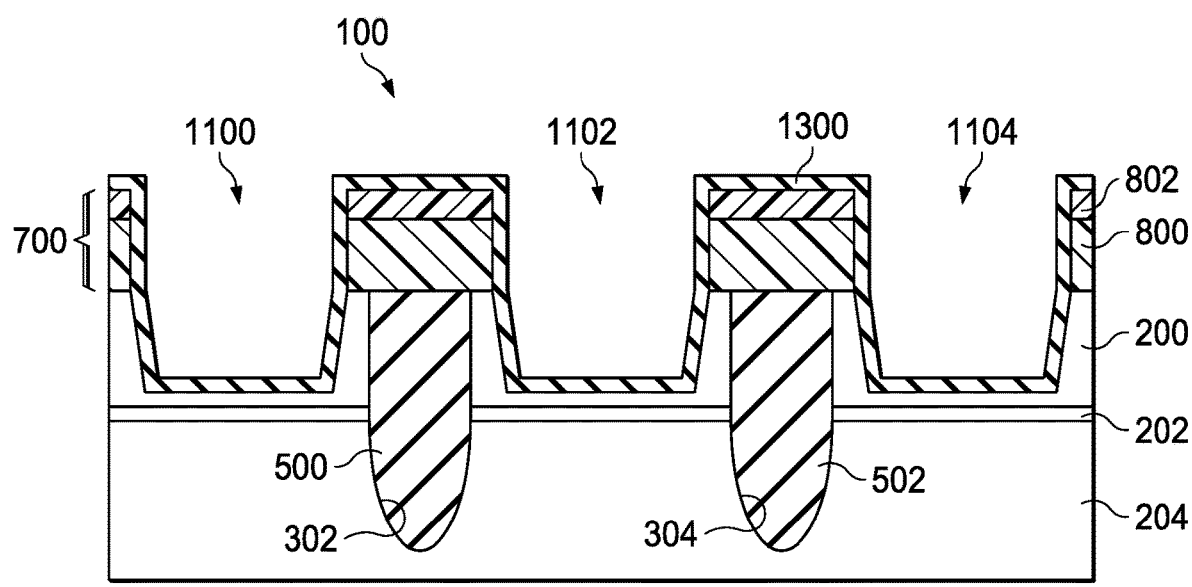
FIG. 14 is an illustration of a cross-sectional view of a semiconductor with cavities in accordance with an illustrative embodiment.

With reference next to FIG. 14, an illustration of a cross-sectional view of a semiconductor with cavities is depicted in accordance with an illustrative embodiment. In this depicted example, semiconductor 100 is shown in a cross-sectional view taken along lines 14-14 in FIG. 13.

In this illustrative example, liner 1300 is comprised of a material selected from at least one of silicon oxide ($SiO_2$), silicon nitride ($SiN_x$), aluminum oxide ($Al_2O_3$), or some other dielectric layer. In this illustrative example, liner 1300 can have a thickness from about 30 Ångströms to about 100 Ångströms.

As used herein, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

Figure 15:
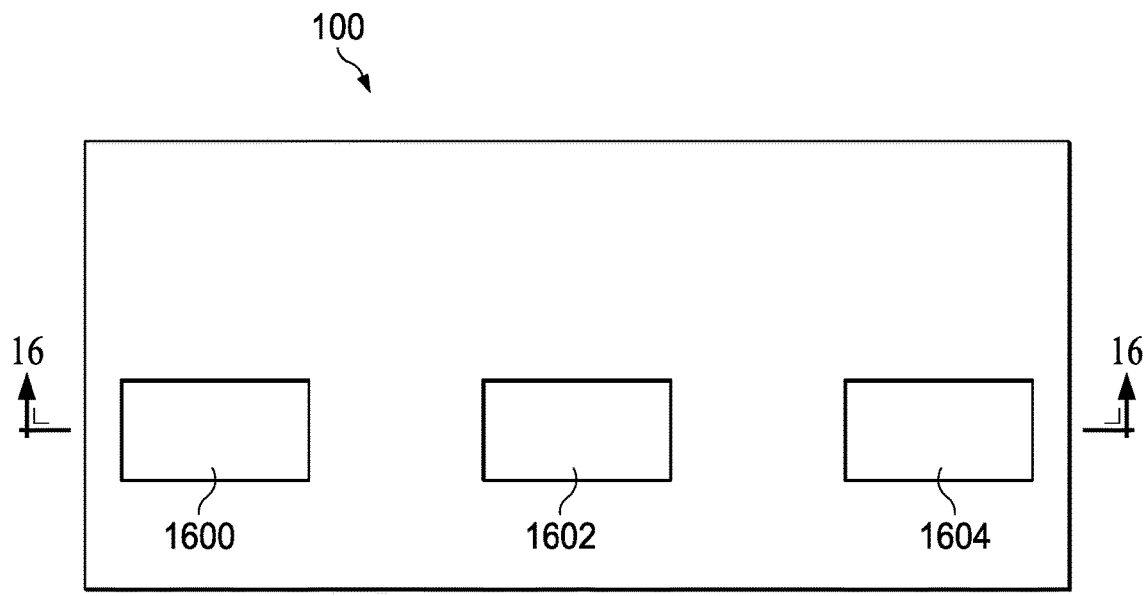
FIG. 15 is an illustration of a top plan view of a semiconductor with active areas in accordance with an illustrative embodiment.

Turning now to FIG. 15, an illustration of a top plan view of a semiconductor with active areas is depicted in accordance with an illustrative embodiment. In this figure, an implantation process has been performed prior to removing liner 1300 in FIGS. 13-14. In the illustrative example, liner 1300 functions as a screening layer to reduce damage to semiconductor 100. As depicted in this example, liner 1300 is removed after implanting dopants to form active areas. In this example, the active areas in semiconductor 100 take the form of n-well 1600, n-well 1602, and n-well 1604.

Figure 16:
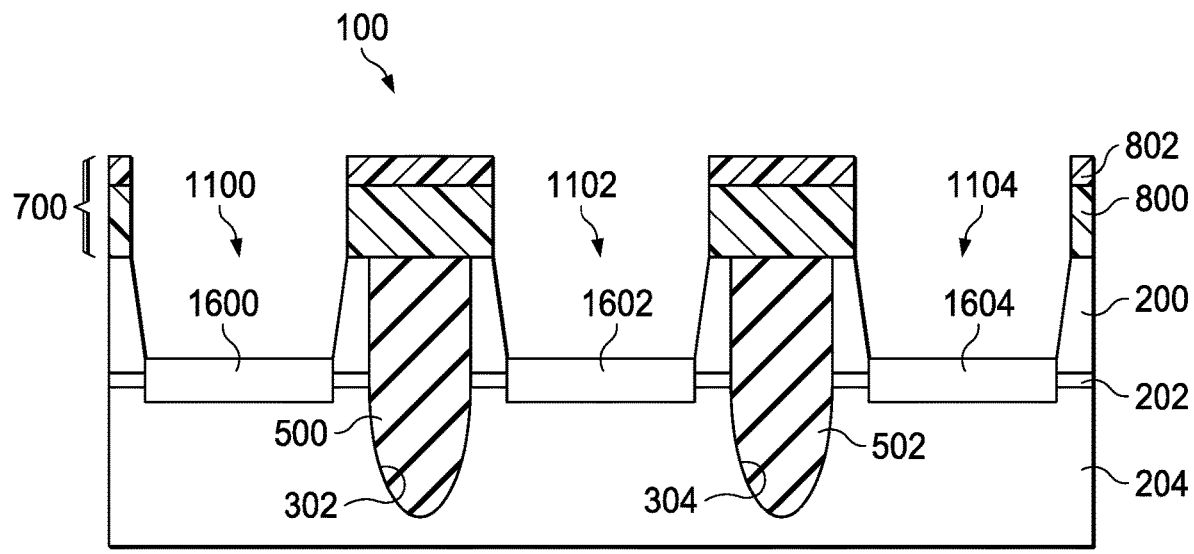
FIG. 16 is an illustration of a cross-sectional view of a semiconductor with active areas with an illustrative embodiment.

Referring to FIG. 16, an illustration of a cross-sectional view of a semiconductor with active areas is depicted in accordance with an illustrative embodiment. In this depicted example, semiconductor 100 is shown in a cross-sectional view taken along lines 16-16 in FIG. 15.

In this cross-sectional view, n-well 1600, n-well 1602, and n-well 1604 are formed using an energy level for implanting the dopants that is selected to minimize the lateral straggle as much as possible while still providing a desired doping levels in the n-wells. For example, a low-energy implantation can be performed in contrast to a high-energy implantation. In other words, the energy level can be selected such that spreading of dopants laterally from a direction of implantation can be reduced as much as possible or to some desired level while obtaining a desired doping level in the active area, such as in an n-well.

In this illustrative example, a low-energy implantation of the dopants can be performed using implantation energies less than about 20 keV. For example, the implantation energies from about 5 keV to about 20 keV can achieve a lateral straggle of less than about 15 nm. These implantation energies are in contrast to higher implantation energies used in semiconductor fabrication that may be from about 40 keV to over 200 keV.

As a result, the energy level can be selected to provide the lateral straggle of the dopants that occurs at a desired level. In other words, the energy level can be selected to reduce the lateral straggle while still producing a desired doping in the active areas such as n-wells.

As seen in this cross-sectional view, n-well 1600, n-well 1602, and n-well 1604 extend below cavity 1100, cavity 1102, and cavity 1104. These n-wells extend through first silicon germanium layer 200 and through silicon layer 202 into second silicon germanium layer 204. In this example, these n-wells can have a width corresponding to the cavities. In the illustrative example, the depth of the n-wells can be about 40 nm.

Figure 17:
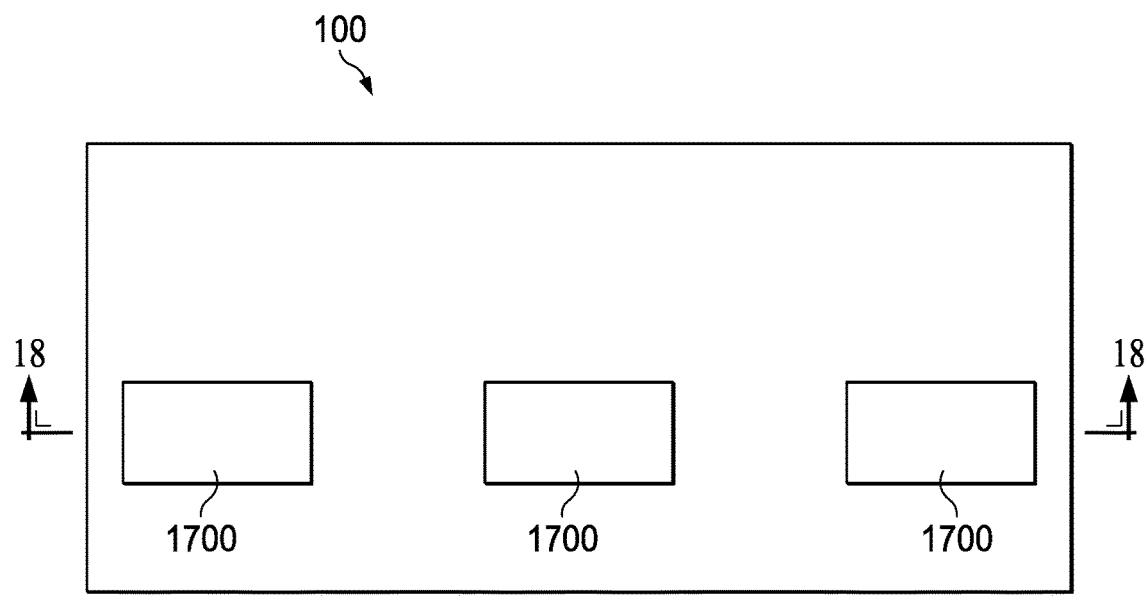
FIG. 17 is an illustration of a top plan view of a semiconductor with an ohmic metal in accordance with an illustrative embodiment.

Turning to FIG. 17, an illustration of a top plan view of a semiconductor with an ohmic metal is depicted in accordance with an illustrative embodiment. Ohmic metal 1700 has been deposited and chemical mechanical polishing (CMP) has been performed such that ohmic metal 1700 is located in cavity 1100, cavity 1102, and cavity 1104.

Figure 18:
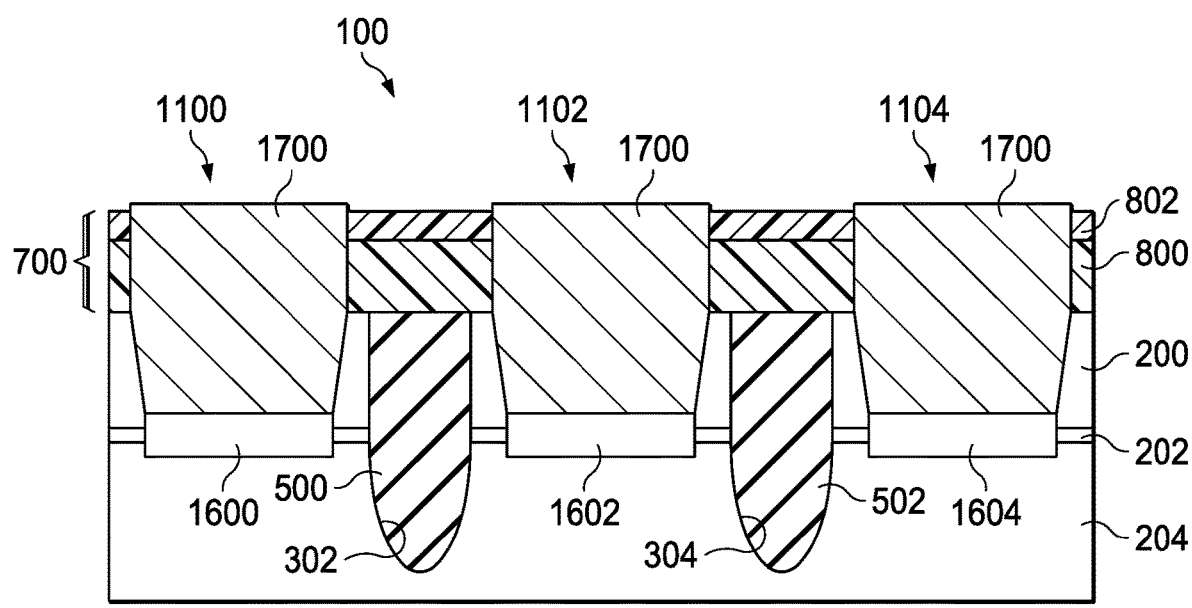
FIG. 18 is an illustration of a cross-sectional view of a semiconductor with active areas in accordance with an illustrative embodiment.

With reference to FIG. 18, an illustration of a cross-sectional view of a semiconductor with active areas is depicted in accordance with an illustrative embodiment. In this depicted example, semiconductor 100 is shown in a cross-sectional view taken along lines 18-18 in FIG. 17.

As depicted, ohmic metal 1700 in cavity 1100 is in direct contact with n-well 1600; ohmic metal 1700 in cavity 1102 is in direct contact with n-well 1602; and ohmic metal 1700 in cavity 1104 is in direct contact with n-well 1604. In this illustrative example, ohmic metal 1700 can be any metal that can be used to make ohmic contacts to an active area.

Figure 19:
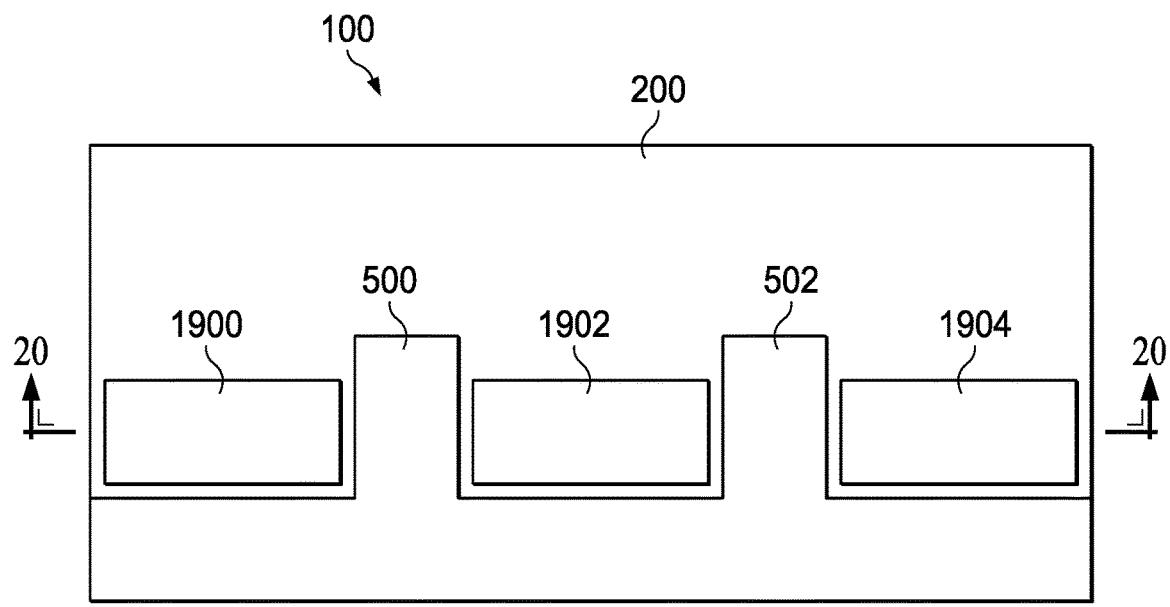
FIG. 19 is an illustration of a top plan view of a semiconductor with contacts in accordance with an illustrative embodiment.

Turning to FIG. 19, an illustration of a top plan view of a semiconductor with contacts is depicted in accordance with an illustrative embodiment. In this illustrative example, semiconductor 100 has been processed to form metal contact 1900, metal contact 1902, and metal contact 1904 from ohmic metal 1700 in FIGS. 17-18.

Figure 20:
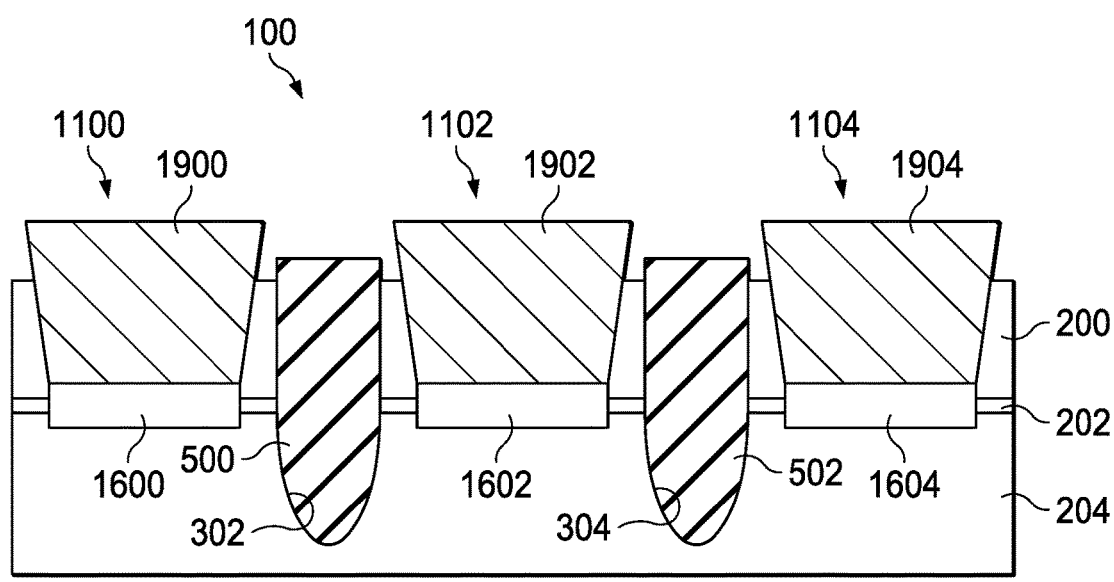
FIG. 20 is an illustration of a cross-sectional view of a semiconductor with active areas in accordance with an illustrative embodiment.

In FIG. 20, an illustration of a cross-sectional view of a semiconductor with active areas is depicted in accordance with an illustrative embodiment. In this depicted example, semiconductor 100 is shown in a cross-sectional view taken along lines 20-20 in FIG. 19. In this view, a hard mask has been applied with a pattern such that an etching process forms metal contact 1900, metal contact 1902, and metal contact 1904. Further, this pattern in etching also removes bilayer hard mask 700 from semiconductor 100.

The illustration of the different steps in FIGS. 1-20 are provided to illustrate steps that can be used to fabricate contacts to active areas recessed in a semiconductor. In other words, the active areas are below the surface of the semiconductor. In this illustrative example, n-well 1600, n-well 1602, and n-well 1604 are examples of recessed active areas located under cavity 1100, cavity 1102, and cavity 1104, respectively.

In the illustrative example, this process can be used to fabricate submicron contacts to buried well Si/SiGe field-effect devices. With the process flow in FIGS. 1-20, a flatter surface of the semiconductor is possible. A formation of a next level structure such as at least one of a gate, a contact, a back end of line (BEOL) structure, or other structures are enabled in the illustrative examples.

In addition, the implant surface becomes closer to Si well (channel) with the recessed active area, so the low-energy implant can achieve the desired active area. With the use of a low-energy implant, the implant straggle is controlled to define the implant boundary to have at least one of a sharper corner, a desired width, or other desired shape or dimensions for the semiconductor structure.

The illustration of the steps in FIGS. 1-20 are not meant to limit the manner in which other illustrative examples can be used to fabricate contacts to active areas in semiconductors. For example, a single layer mask can be used in place of bilayer hard mask 700 in other illustrative examples. Although three cavities are shown as being attached, other illustrative examples may involve only etching a single cavity. Further, other steps can be performed, but are not shown to avoid obscuring features of the invention. For example, photoresist deposition and patterning steps can be used to lay down various materials such as hard masks or other layers.

In some examples, bilayer hard mask 700 does not need to be removed as shown in FIG. 19 and FIG. 20. Other processing can be performed to fabricate the structure with bilayer hard mask 700 still in place. In other words, bilayer hard mask 700 can be removed at a later time after other processing to form the semiconductor structure has occurred. In yet other examples, bilayer hard mask 700 may remain in place as a component in the semiconductor structure. For example, bilayer hard mask 700 can be used as a gate oxide.

Thus, one or more illustrative examples enable overcoming a technical problem with manufacturing semiconductors with smaller features. One or more illustrative examples provide a technical solution to fabricate contacts to active areas in a semiconductor. The semiconductor can be a semiconductor substrate or a semiconductor structure comprised of one or more different layers of semiconductors.

The illustrative examples provide a method for fabricating a semiconductor structure. In one illustrative example, isolation structures are formed in a semiconductor. A cavity is etched in the semiconductor between two of the isolation structures in the semiconductor. Dopants are implanted into a bottom side of the cavity to form a doped region in the semiconductor below the cavity between the two isolation structures. A contact is formed in the cavity. The contact is on the doped region and in direct contact with the doped region.

Thus, the illustrative examples provide a method and semiconductor structure for contacts to active areas. The illustrative examples can be implemented to form submicron contacts to active areas in semiconductor structures in which a device footprint is reduced using the one or more operations in the illustrative examples. For example, an n-well area can be smaller in size with less straggle of dopants when the dopants are implanted using the operations in the illustrative examples. Further, an active area can be formed closer to a core area of the device. The core area can be a channel area where charge carriers in an n-well reservoir are transferred and manipulated for logic operations.

In one or more illustrative examples, a recess etch and an implantation are performed. A contact is formed in a cavity formed from the recess etch. With a single lithography operation, alignment issues of the contact with an active area are reduced as compared to other currently-used techniques.

In the illustrative example, fabrication of Si/SiGe nanoelectronics is enabled using this process to create contacts to buried active areas. The process in the illustrative examples can also be used to fabricate semiconductor structures for quantum processing devices. For example, the contacts can be made to active areas in devices selected from at least one of an optical waveguide, a slot waveguide, a ridge waveguide, a rib waveguide, a buried optical waveguide, a suspended waveguide, an optical resonator, a photon-emitting quantum memory using a point defect within the silicon carbide device layer, or other suitable structure for use in a quantum processing device.

Figure 21:
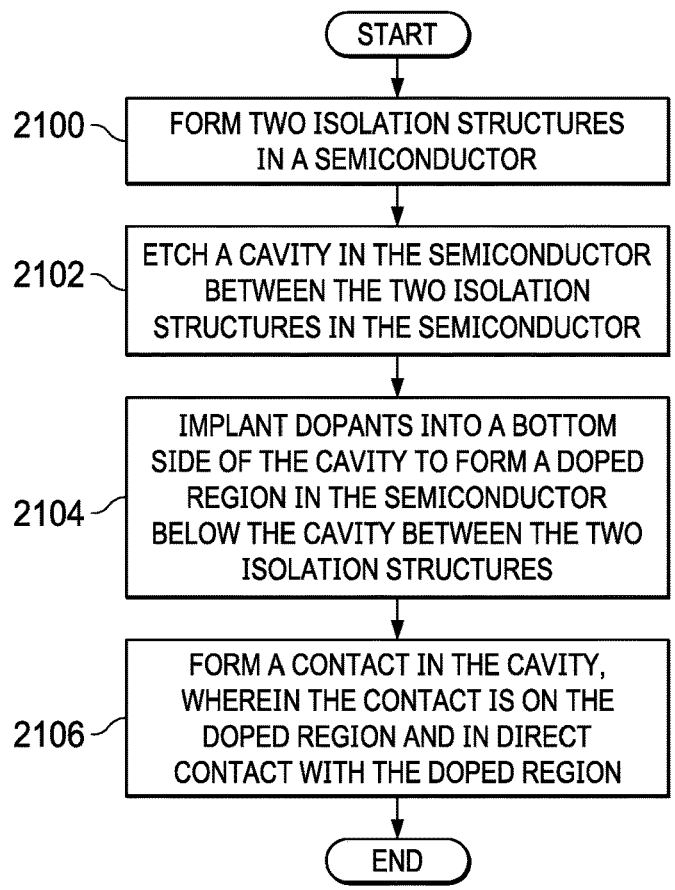
FIG. 21 is an illustration of a flowchart of a process for fabricating a semiconductor structure in accordance with an illustrative embodiment.

With reference next to FIG. 21, an illustration of a flowchart of a process for fabricating a semiconductor structure is depicted in accordance with an illustrative embodiment. The process begins by forming two isolation structures in a semiconductor (operation 2100). In operation 2100, the semiconductor can take a number of different forms. For example, the semiconductor can be selected from at least one of a set of semiconductor layers and a substrate.

In this illustrative example, the two isolation structures formed from a dielectric material fills two cavities. In this example, these isolation structures are shallow trench isolation (STI) structures. The semiconductor can be comprised of a material selected from at least one of silicon, silicon germanium, indium phosphate, silicon carbide, gallium arsenide, gallium nitride, or some other suitable material. For example, the suitable material can be a material that is used with a buried well high-electron-mobility transistor (HEMT) structure. HEMT is a field-effect transistor incorporating a junction between two materials with different band gaps (i.e. a heterojunction) as the channel instead of a doped region.

The process etches a cavity in the semiconductor between the two isolation structures in the semiconductor (operation 2102). The process implants dopants into a bottom side of the cavity to form a doped region in the semiconductor below the cavity between the two isolation structures (operation 2104). In operation 2104, implantation of the dopants forms an active area that is recessed within the semiconductor. The dopants are one of n-type dopants and p-type dopants. In this illustrative example, the active area can be an n-well, a p-well, an n+ region, a p+ region, or some other suitable type of active area. Further, in operation 2104, the dopants are implanted at an energy level that reduces a lateral straggle of the dopants to a desired level.

The process forms a contact in the cavity, wherein the contact is on the doped region and in direct contact with the doped region (operation 2106). The process terminates thereafter.

Figure 22:
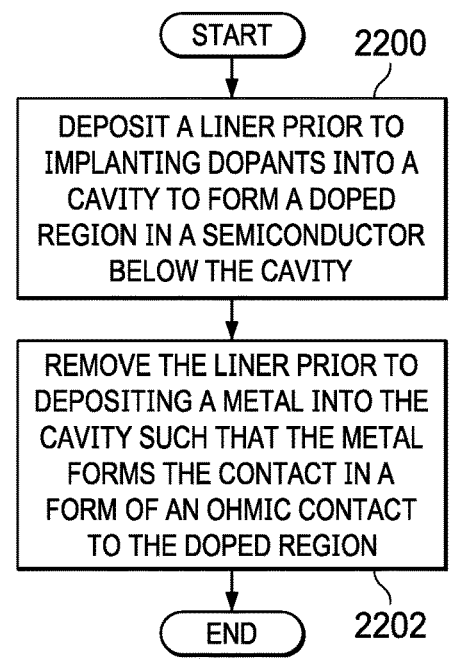
FIG. 22 is an illustration of a flowchart of additional operations in a process for fabricating a semiconductor structure in accordance with an illustrative embodiment.

With reference next to FIG. 22, an illustration of a flowchart of additional operations in a process for fabricating a semiconductor structure is depicted in accordance with an illustrative embodiment. In this flowchart, an example of additional operations that can be performed in the process in FIG. 21 is depicted.

The process deposits a liner prior to implanting dopants into a cavity to form a doped region in a semiconductor below the cavity (operation 2200). This operation can be performed prior to operation 2104 in FIG. 21.

The process removes the liner prior to depositing a metal into the cavity such that the metal forms the contact in a form of an ohmic contact to the doped region (operation 2104). This operation can be performed prior to operation 2106 in FIG. 21. The process terminates thereafter.

Figure 23:
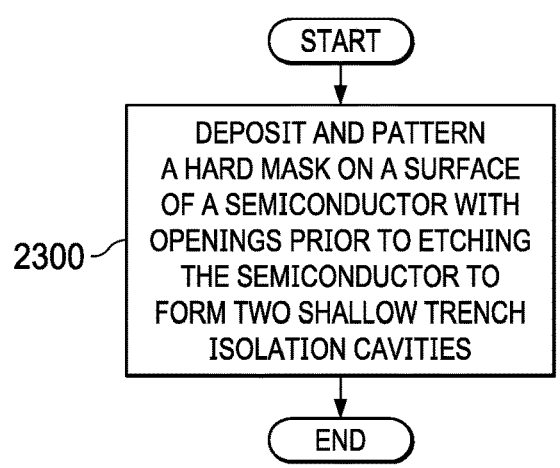
FIG. 23 is an illustration of a flowchart of additional operations in a process for fabricating a semiconductor structure in accordance with an illustrative embodiment.

With reference next to FIG. 23, an illustration of a flowchart of additional operations in a process for fabricating a semiconductor structure is depicted in accordance with an illustrative embodiment. In this flowchart, an example of additional operations that can be performed in the process in FIG. 21 is depicted.

The process deposits and patterns a hard mask on a surface of a semiconductor with openings prior to etching the semiconductor to form two shallow trench isolation cavities (operation 2300). The process terminates thereafter.

Figure 24:
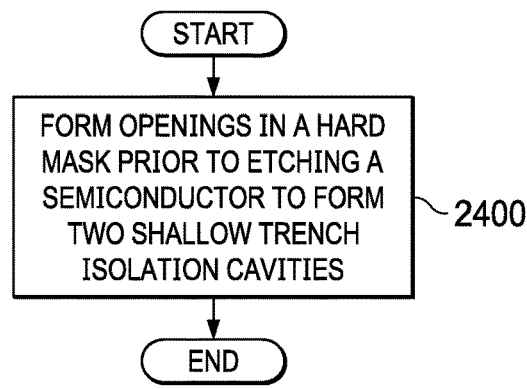
FIG. 24 is an illustration of a flowchart of additional operations in a process for fabricating a semiconductor structure in accordance with an illustrative embodiment.

With reference next to FIG. 24, an illustration of a flowchart of additional operations in a process for fabricating a semiconductor structure is depicted in accordance with an illustrative embodiment. In this flowchart, an example of additional operations that can be performed in the process in FIG. 21 is depicted.

The process forms openings in a hard mask prior to etching a semiconductor to form two shallow trench isolation cavities (operation 2400). The process terminates thereafter. The openings define areas for etching the two shallow trench isolation cavities.

With reference next to FIG. 25, an illustration of a flowchart of forming isolation structures in a semiconductor structure is depicted in accordance with an illustrative embodiment. In this flowchart, an example of one manner in which operation 2100 in FIG. 21 can be performed.

The process begins by etching a semiconductor to form two shallow trench isolation cavities in the semiconductor (operation 2502). The process deposits a dielectric into the two shallow trench isolation cavities to form two isolation structures (operation 2502). The process terminates thereafter.

With reference next to FIG. 26, an illustration of a flowchart of forming a contact is depicted in accordance with an illustrative embodiment. In this flowchart, an example of one manner in which operation 2106 in FIG. 21 can be performed is depicted.

The process deposits a metal on the semiconductor, wherein the metal fills a cavity (operation 2600). The process removes the metal from an area outside of the cavity wherein the metal remaining in the cavity forms a contact for a doped region (operation 2602). The process terminates thereafter.

Turning next to FIG. 27, an illustration of a flowchart of a process for fabricating a semiconductor structure is depicted in accordance with an illustrative embodiment. In this example, the semiconductor structure is formed in a semiconductor comprised of a first silicon germanium layer, a silicon layer, and a second silicon germanium layer. These layers can be located on a substrate which can be a silicon germanium substrate, a silicon substrate, or some other suitable type of substrate.

The process begins by etching a first silicon germanium layer on a silicon layer located on a second silicon germanium layer on a substrate to form shallow trench isolation cavities extending through the first silicon germanium layer and the silicon layer into the second silicon germanium layer (operation 2700). The process deposits a dielectric into the shallow trench isolation cavities to form isolation structures (operation 2702).

The process etches the first silicon germanium layer on the silicon layer located on the second silicon germanium layer in an area located between two of the isolation structures to form a cavity (operation 2704). The process performs a low-energy implant into the cavity to form an n-well (operation 2706). In the illustrative example, a low-energy implant can be an implantation of dopants performed using an implant energy from about 5 keV to about 20 keV. The energy level in operation 2706 can be any energy level that reduces a lateral straggle of dopants to a desired level. The energy level can be selected to minimize the lateral straggle as much as possible while still providing a desired doping level in the n-well.

The process deposits a metal such that the metal in the cavity contacts the n-well (operation 2708). The process terminates thereafter. In operation 2708, the contact is a direct contact of the metal in the cavity to the n-well. In this example, the metal can be any metal that can be used to make an ohmic contact to the semiconductor such as a Si/SiGe structure.

Figure 28:
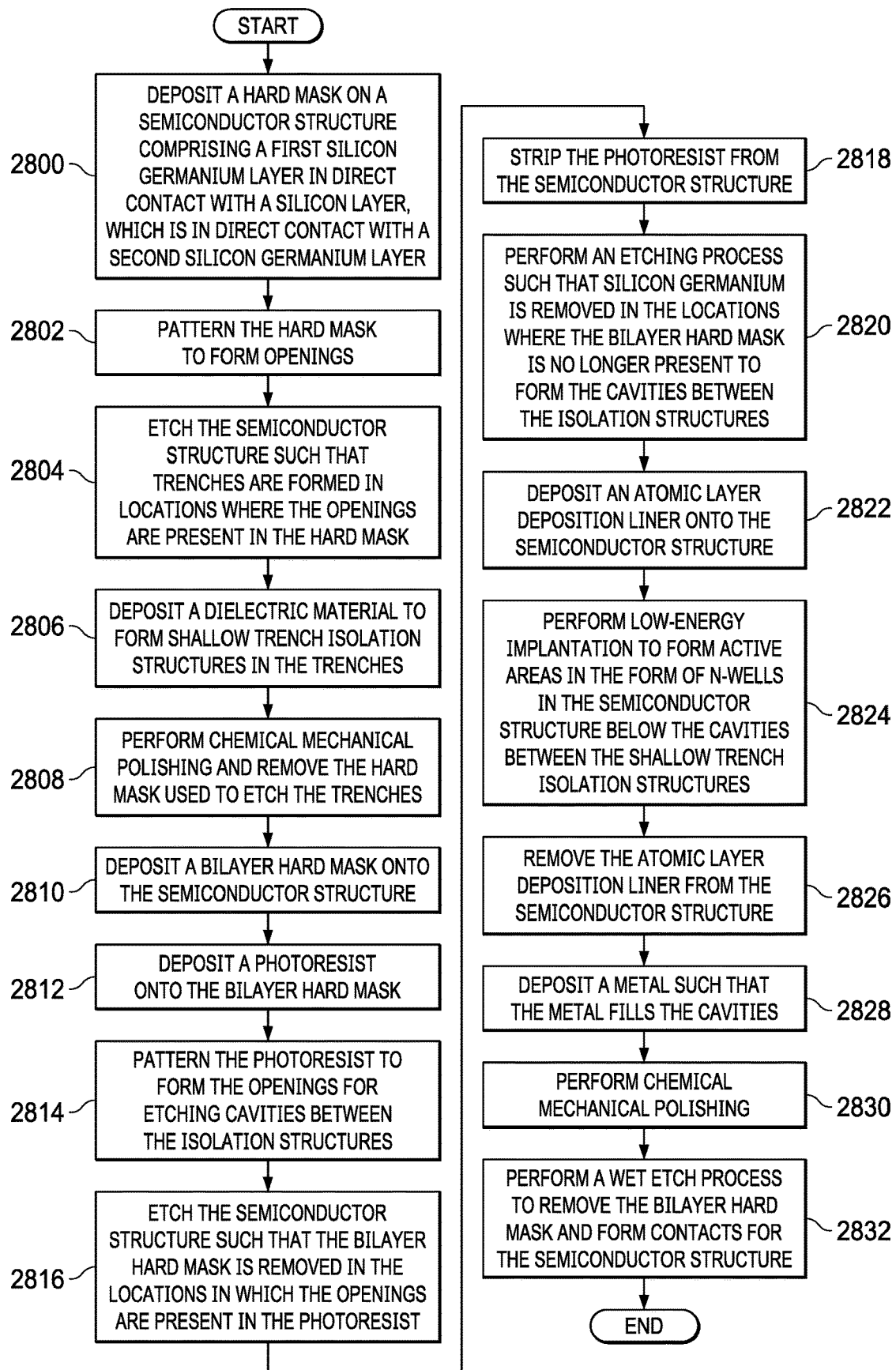
FIG. 28 is an illustration of a flowchart of a process for fabricating a contact to a buried channel layer in accordance with an illustrative embodiment.

With reference to FIG. 28, an illustration of a flowchart of a process for fabricating a contact to a buried channel layer is depicted in accordance with an illustrative embodiment. In this example, the buried channel layer is a buried active area such as an n-well. In this example, fabrication can be for a submicron contact to a buried well Si/SiGe device. This process can be used to fabricate a semiconductor structure as illustrated in the process depicted in FIGS. 1-20.

The process begins by depositing a hard mask on a semiconductor structure comprising a first silicon germanium layer in direct contact with a silicon layer, which is in direct contact with a second silicon germanium layer (operation 2800). The process patterns the hard mask to form openings (operation 2802). The process etches the semiconductor structure such that trenches are formed in locations where the openings are present in the hard mask (operation 2804). This etching can be part of a shallow trench isolation technique. Operation 2804 can be a shallow trench isolation (STI) etch that forms tapered sidewalls with a rounded bottom to reduce or prevent any stress or electric field concentration. In this example, the shallow trench isolation etch can use main etch gases such as HBr, $Cl_2$, or $CF_4$ along with additional gases such as $O_2$ to passivate the Si or SiGe sidewall during the etching operation.

The process deposits a dielectric material to form shallow trench isolation structures in the trenches (operation 2806). In operation 2806, the dielectric material can be a silicon oxide or some other suitable material. Further, more than one type of dielectric material can be used in operation 2806.

The process performs chemical mechanical polishing and removes the hard mask used to etch the trenches (operation 2808). The process then deposits a bilayer hard mask onto the semiconductor structure (operation 2810). The process deposits a photoresist onto the bilayer hard mask (operation 2812). The process then patterns the photoresist to form the openings for etching cavities between the isolation structures (operation 2814).

The process etches the semiconductor structure such that the bilayer hard mask is removed in the locations in which the openings are present in the photoresist (operation 2816).

The process strips the photoresist from the semiconductor structure (operation 2818). The process performs an etching process such that silicon germanium is removed in the locations where the bilayer hard mask is no longer present to form cavities between the isolation structures (operation 2820). In operation 2820, the etching process is performed into the first silicon germanium layer and not into or through a silicon layer in this illustrative example. In this operation, the etch can be an active recess etch that provides a vertical sidewall profile and a flat bottom profile with square bottom corners. This shape leads to a uniform implant when forming an n-well or other active area. This etching can be performed using very lean main etch gases such as $CF_4$ or $Cl_2$ without any passivating chemistry.

In this depicted example, the etching process can be performed to form cavities each having a width from about 50 nm to about 200 nm. Further, in this example, the cavities can have a depth from about 50 nm to about 200 nm surface of the semiconductor structure.

The process deposits an atomic layer deposition liner onto the semiconductor structure (operation 2822). This liner can reduce damage to the semiconductor structure when ion implantation is performed. As an atomic layer deposition liner, the liner can be comprised of a material selected from at least one of silicon oxide ($SiO_2$), silicon nitride ($SiN_x$), aluminum oxide ($Al_2O_3$), or some other dielectric layer. In this illustrative example, the atomic layer deposition liner can have a thickness from about 30 Ångströms to about 100 Ångströms. The particular thickness is selected to enable a desired amount of ions to be implanted while reducing damage to underlying material in the semiconductor structure located below the liner.

The process then performs low-energy implantation to form active areas in a form of n-wells in the semiconductor structure below the cavities between the shallow trench isolation structures (operation 2824). In operation 2824, the energy level used for implantation can be, for example, from about 5 keV to about 20 keV.

In this illustrative example, the ion implantation energy level can be selected to reduce a lateral straggle or maintain the lateral straggle of dopants implanted into the semiconductor structure at a desired level. In this illustrative example, the lateral straggle is the distance at which implanted dopants may spread laterally from an axis along which ion implantation is performed. By reducing this type of spread of dopants during implantation, features such as the size of active areas can be made smaller as compared to current techniques using high-energy ion implantation.

The process removes the atomic layer deposition liner from the semiconductor structure (operation 2826). The process deposits a metal such that the metal fills the cavities (operation 2828). In operation 2828, the metal is in direct contact with the n-wells. The metal is an ohmic metal and is a metal or metal alloy that can be used to make ohmic contacts to the semiconductor structure. The process performs chemical mechanical polishing (operation 2830). The process performs a wet etch process to remove the bilayer hard mask and form contacts for the semiconductor structure (operation 2832). The process terminates thereafter. In the illustrative example, operation 2832 is an optional operation. In some illustrative examples, the hard mask may remain and form a structure such as a gate oxide.

Thus, the process in different flowcharts in FIGS. 21-28 can be implemented to fabricate contacts to active areas recessed in a semiconductor. For example, this process can be used to fabricate submicron contacts to buried well Si/SiGe field-effect devices.

The flowcharts and block diagrams in the different depicted embodiments illustrate the architecture, functionality, and operation of some possible implementations of apparatuses and methods in an illustrative embodiment. In this regard, each block in the flowcharts or block diagrams can represent at least one of a module, a segment, a function, or a portion of an operation or step. For example, one or more of the blocks can be implemented as instructions in program code, hardware, or a combination of the program code and hardware to control fabrication equipment for manufacturing semiconductor structures. When implemented in hardware, the hardware can, for example, take the form of integrated circuits that are manufactured or configured to perform one or more operations in the flowcharts or block diagrams. When implemented as a combination of program code and hardware, the implementation may take the form of firmware. Each block in the flowcharts or the block diagrams can be implemented using special purpose hardware systems that perform the different operations or combinations of special purpose hardware and program code run by the special purpose hardware to operate fabrication equipment to manufacture semiconductor structures.

In some alternative implementations of an illustrative embodiment, the function or functions noted in the blocks may occur out of the order noted in the figures. For example, in some cases, two blocks shown in succession may be performed substantially concurrently, or the blocks may sometimes be performed in the reverse order, depending upon the functionality involved. Also, other blocks may be added in addition to the illustrated blocks in a flowchart or block diagram.

Figure 29:
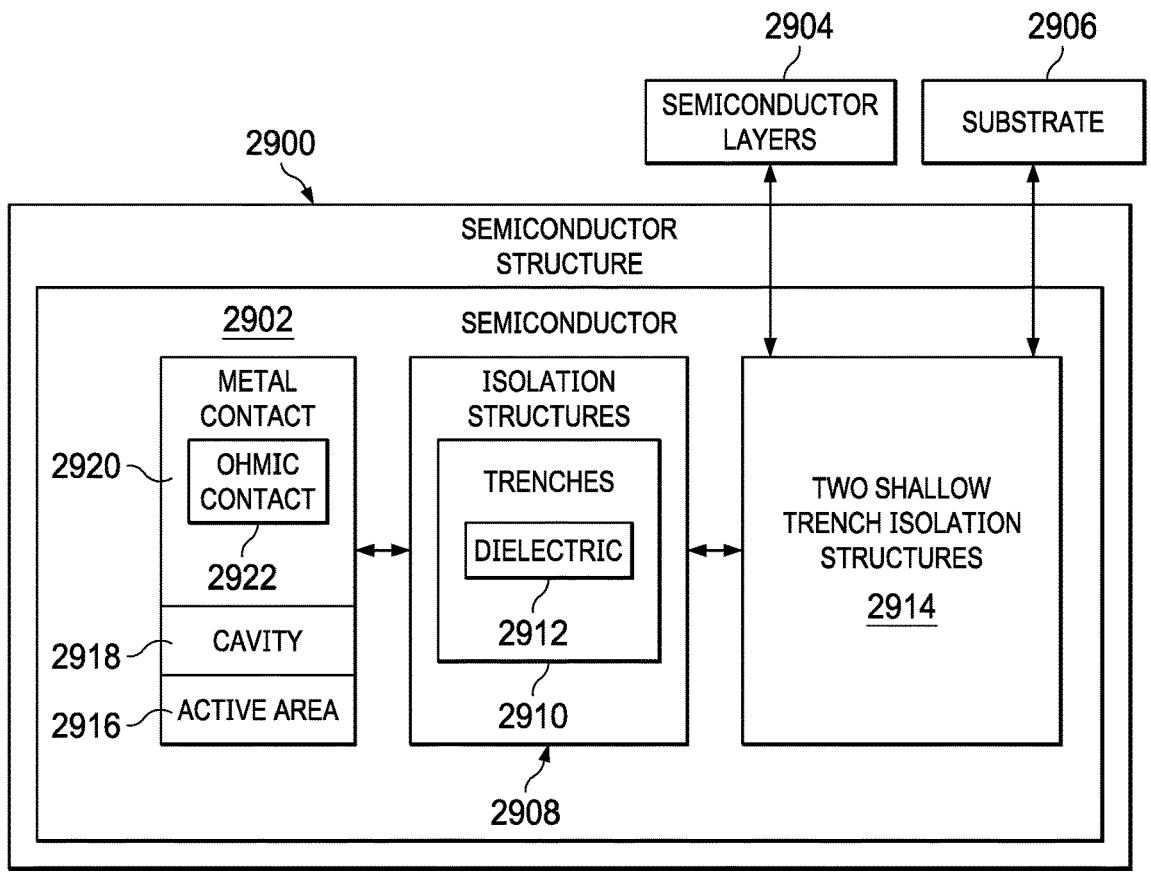
FIG. 29 is an illustration of a block diagram of a semiconductor structure in accordance with an illustrative embodiment.

With reference next to FIG. 29, an illustration of a block diagram of a semiconductor structure is depicted in accordance with an illustrative embodiment. In this illustrative example, semiconductor structure 2900 is an example of a semiconductor structure that can be formed as depicted in the processes and structures shown in FIGS. 1-20 and in the flowcharts in FIGS. 21-28.

In this depicted example, semiconductor structure 2900 is comprised of semiconductor 2902. Semiconductor 2902 is comprised of a material selected from at least one of silicon, silicon germanium, indium phosphate, silicon carbide, gallium arsenide, gallium nitride, or some other suitable material.

Semiconductor 2902 can be at least one of a set of semiconductor layers 2904 or substrate 2906. As depicted, isolation structures 2908 are located in semiconductor 2902. Isolation structures 2908 comprise trenches 2910 with dielectric 2912. In this example, isolation structures 2908 are two shallow trench isolation structures 2914. As depicted, dielectric 2912 can take a number of different forms. For example, dielectric 2912 can be one of silicon dioxide, a fluorine doped silicon dioxide, hafnium silicate, zirconium silicate, hafnium dioxide, zirconium dioxide, and other suitable materials.

Cavity 2918 is located between two of isolation structures 2908. Cavity 2918 can have a depth from about 50 nm to about 200 nm from the surface of semiconductor 2902. Further, cavity 2918 has a width from about 20 nm to about 200 nm in one example.

Active area 2916 is located in semiconductor 2902 below cavity 2918. Active area 2916 can be one of an n-well, a p-well, an n+ region, and a p+ region. Dopants in active area 2916 can be one of n-type dopants and p-type dopants.

In the illustrative example, metal contact 2920 is in cavity 2918. Metal contact 2920 is in direct contact with active area 2916. In this example, metal contact 2920 is ohmic contact 2922.

Figure 30:
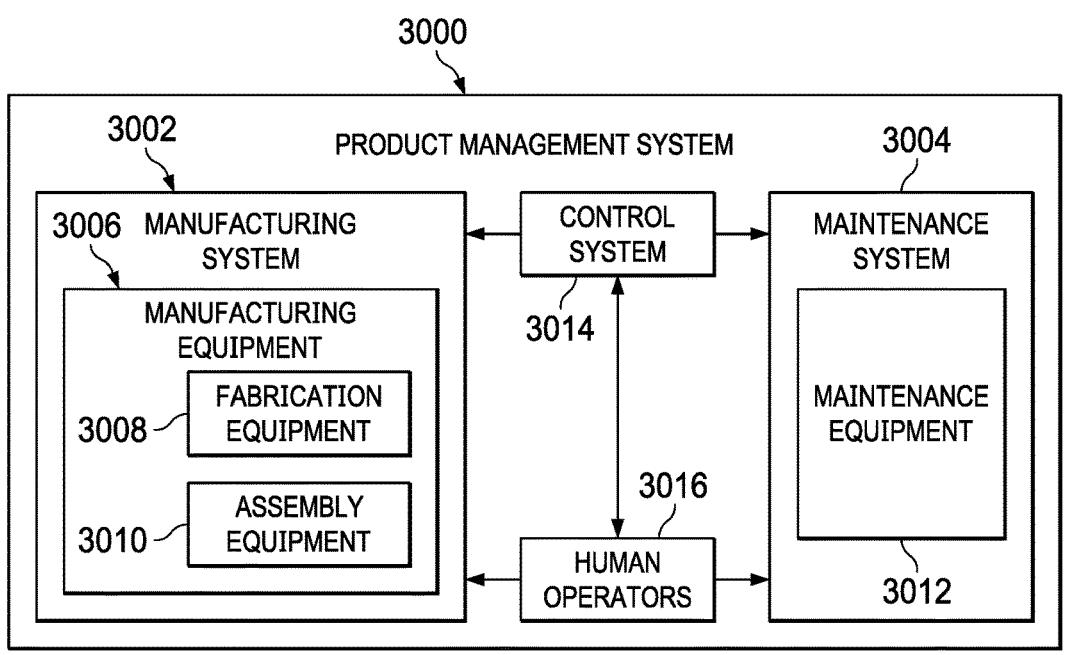
FIG. 30 is an illustration of a block diagram of a product management system in accordance with an illustrative embodiment.

Turning now to FIG. 30, an illustration of a block diagram of a product management system is depicted in accordance with an illustrative embodiment. Product management system 3000 is a physical hardware system. In this illustrative example, product management system 3000 includes at least one of manufacturing system 3002 or maintenance system 3004.

Manufacturing system 3002 is configured to manufacture products. As depicted, manufacturing system 3002 includes manufacturing equipment 3006. Manufacturing equipment 3006 includes at least one of fabrication equipment 3008 or assembly equipment 3010.

Fabrication equipment 3008 is equipment that used to fabricate components for parts used to form a product. Fabrication equipment 3008 can be used to fabricate at least one of metal parts, composite parts, semiconductors, circuits, fasteners, ribs, skin panels, spars, antennas, or other suitable types of parts.

For example, fabrication equipment 3008 can include machines and tools. These machines and tools can be at least one of a drill, a hydraulic press, a furnace, a mold, a composite tape laying machine, a vacuum system, a lathe, or other suitable types of equipment.

With respect to fabricating semiconductor components, fabrication equipment 3008 can comprise at least one of an epitaxial reactor, an oxidation system, a diffusion system, an etching machine, a cleaning machine, a bonding machine, a dicing machine, a wafer saw, an ion implantation machine, a physical vapor deposition system, a chemical vapor deposition system, a photolithography system, an electron-beam lithography system, a plasma etcher, a die attachment machine, a wire bonder, a die overcoat system, molding equipment, a hermetic sealer, an electrical tester, a burn-in oven, a retention bake oven, a UV erase machine, or other suitable types of equipment that can be used to manufacture semiconductor structures.

Assembly equipment 3010 is equipment used to assemble parts to form a product such as a chip, an integrated circuit, a computer, an aircraft, or some other product. Assembly equipment 3010 also can include machines and tools. These machines and tools may be at least one of a robotic arm, a crawler, a fastener installation system, a rail-based drilling system, or a robot.

In this illustrative example, maintenance system 3004 includes maintenance equipment 3012. Maintenance equipment 3012 can include any equipment needed to perform maintenance on a product. Maintenance equipment 3012 may include tools for performing different operations on parts on a product. These operations can include at least one of disassembling parts, refurbishing parts, inspecting parts, reworking parts, manufacturing replacement parts, or other operations for performing maintenance on the product. These operations can be for routine maintenance, inspections, upgrades, refurbishment, or other types of maintenance operations.

In the illustrative example, maintenance equipment 3012 may include ultrasonic inspection devices, x-ray imaging systems, vision systems, drills, crawlers, and other suitable devices. In some cases, maintenance equipment 3012 can include fabrication equipment 3008, assembly equipment 3010, or both to produce and assemble parts that needed for maintenance.

Product management system 3000 also includes control system 3014. Control system 3014 is a hardware system and may also include software or other types of components. Control system 3014 is configured to control the operation of at least one of manufacturing system 3002 or maintenance system 3004. In particular, control system 3014 can control the operation of at least one of fabrication equipment 3008, assembly equipment 3010, or maintenance equipment 3012.

The hardware in control system 3014 can be implemented using hardware that may include computers, circuits, networks, and other types of equipment. The control may take the form of direct control of manufacturing equipment 3006. For example, robots, computer-controlled machines, and other equipment can be controlled by control system 3014. In other illustrative examples, control system 3014 can manage operations performed by human operators 3016 in manufacturing or performing maintenance on a product. For example, control system 3014 can assign tasks, provide instructions, display models, or perform other operations to manage operations performed by human operators 3016. In these illustrative examples, the different steps described and illustrated for fabricating contacts to recessed active areas in semiconductor structures can be implemented using control system 3014.

In the different illustrative examples, human operators 3016 can operate or interact with at least one of manufacturing equipment 3006, maintenance equipment 3012, or control system 3014. This interaction can occur to manufacture semiconductor structures and other components for products such as semiconductor devices or components for use in products such as aircraft, spacecraft, communications systems, micro-electromechanical systems, photonic devices, or superconducting single photon detectors.

Thus, the illustrative examples provide a method and semiconductor structure for contacts to active areas. One illustrative example provides a method for fabricating a semiconductor structure. In one illustrative example, isolation structures are formed in a semiconductor. A cavity is etched in the semiconductor between two of the isolation structures in the semiconductor. Dopants are implanted into a bottom side of the cavity to form a doped region in the semiconductor below the cavity between the two isolation structures. The doped region is a recessed active area in the illustrative example. A contact is formed in the cavity. The contact is on the doped region and in direct contact with the doped region.

The illustrative examples can be implemented to form sub-micron contacts to active areas in semiconductor structures in which the device footprint is reduced using the one or more operations in the illustrative examples. For example, an n-well area can be smaller in size with less straggle of dopants when implanted using the operations in the illustrative examples. Further, the active area can be formed closer to the core area of the device.

In one or more examples, a recess etch and ion implantation are performed. A contact is formed in a cavity formed form the recess etch. With a single lithography operation, alignment issues of the contact with the active area are reduced.

The description of the different illustrative embodiments has been presented for purposes of illustration and description and is not intended to be exhaustive or limited to the embodiments in the form disclosed. The different illustrative examples describe components that perform actions or operations. In an illustrative embodiment, a component can be configured to perform the action or operation described. For example, the component can have a configuration or design for a structure that provides the component an ability to perform the action or operation that is described in the illustrative examples as being performed by the component. Further, to the extent that terms "includes", "including", "has", "contains", and variants thereof are used herein, such terms are intended to be inclusive in a manner similar to the term "comprises" as an open transition word without precluding any additional or other elements.

Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A semiconductor structure comprising:
   a first silicon germanium layer;
   a second silicon germanium layer;
   a silicon layer between the first and second silicon germanium layers;
   first and second shallow trench isolation structures extending through the first silicon germanium layer, the silicon layer and the second silicon germanium layer;
   a first cavity on one side of the first shallow trench isolation structure, a second cavity between the first and second shallow trench isolation structures, and a third cavity on one side of the second shallow trench isolation structure;
   first, second, and third active areas below the respective first, second and third cavities, wherein the first, second and third active areas are in contact with the silicon layer; and
   first, second and third metal contacts in the respective first, second and third cavities, wherein the first, second and third metal contacts are formed by depositing metal in the first, second and third cavities, respectively, and wherein the first, second and third metal contacts are isolated from the silicon layer by the respective first, second and third active areas.

2. The semiconductor structure of claim 1, wherein the first metal contact is in direct contact with the first active area, the second metal contact is in direct contact with the second active area, and the third metal contact is in direct contact with the third active area.

3. The semiconductor structure of claim 1, wherein the first, second and third metal contacts are not in direct contact with the silicon layer, and wherein the first, second and third metal contacts are separated from the silicon layer by the respective first, second and third active areas.

4. The semiconductor structure of claim 1, wherein the first and second shallow trench isolation structures are separated from the first, second and third active areas.

5. A semiconductor structure comprising:
   a first silicon germanium layer;
   a second silicon germanium layer;
   a silicon layer between the first and second silicon germanium layers;
   first, second and third cavities in the first silicon germanium layer;
   a first shallow trench isolation structure between the first and second cavities and extending through the first silicon germanium layer, the silicon layer and the second silicon germanium layer;
   a second shallow trench isolation structure between the third and second cavities and extending through the first silicon germanium layer, the silicon layer and the second silicon germanium layer;
   first, second, and third active areas below the respective first, second and third cavities, wherein the first, second and third active areas are in contact with the silicon layer; and
   first, second and third metal contacts in the respective first, second and third cavities, wherein the first, second and third metal contacts are formed by depositing metal in the first, second and third cavities, respectively, and wherein the first, second and third metal contacts are isolated from the silicon layer by the respective first, second and third active areas.

6. The semiconductor structure of claim 5, wherein the first metal contact is in direct contact with the first active area, the second metal contact is in direct contact with the second active area, and the third metal contact is in direct contact with the third active area.

7. The semiconductor structure of claim 5, wherein the first, second and third metal contacts are not in direct contact with the silicon layer, and wherein the first, second and third metal contacts are separated from the silicon layer by the respective first, second and third active areas.

8. The semiconductor structure of claim 5, wherein the first and second shallow trench isolation structures are separated from the first, second and third active areas.

* * * * *